(12) United States Patent
Kim et al.

(10) Patent No.: US 12,147,634 B2
(45) Date of Patent: *Nov. 19, 2024

(54) TOUCH SENSOR AND DISPLAY DEVICE INCLUDING THE SAME

(71) Applicant: SAMSUNG DISPLAY CO., LTD., Yongin-si (KR)

(72) Inventors: Kwang Hyeok Kim, Yongin-si (KR); Mi Young Kim, Yongin-si (KR); So Yeon Park, Yongin-si (KR); Yong Hwan Park, Yongin-si (KR); Sang Hyun Jun, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/335,846

(22) Filed: Jun. 15, 2023

(65) Prior Publication Data

US 2023/0341981 A1    Oct. 26, 2023

Related U.S. Application Data

(63) Continuation of application No. 17/816,625, filed on Aug. 1, 2022, now Pat. No. 11,703,984, which is a (Continued)

(30) Foreign Application Priority Data

May 14, 2020    (KR) .......................... 10-2020-0057862

(51) Int. Cl.
*G06F 3/044* (2006.01)
*G06F 3/041* (2006.01)
*H10K 59/40* (2023.01)

(52) U.S. Cl.
CPC .......... *G06F 3/0445* (2019.05); *G06F 3/0412* (2013.01); *G06F 3/04164* (2019.05); *H10K 59/40* (2023.02)

(58) Field of Classification Search
CPC ................................................... G06F 4/01464
See application file for complete search history.

(56) References Cited

U.S. PATENT DOCUMENTS 10,481,729 B2    11/2019    Park
10,497,896 B2    12/2019    Lee et al.
(Continued)

FOREIGN PATENT DOCUMENTS

KR    10-2018-0076784    7/2018
KR    10-2019-0009147    1/2019
KR    10-2019-0025798    3/2019

*Primary Examiner* — Sanjiv D. Patel
(74) *Attorney, Agent, or Firm* — F. CHAU & ASSOCIATES, LLC

(57) ABSTRACT

A touch sensor includes a sensing electrode that receives a touch input disposed on a sensing area of a substrate; and a plurality of sensing lines disposed on a non-sensing area of the substrate. Each of the plurality of sensing lines includes a first area and a second area, and first and second metal layers electrically coupled to the sensing electrode. The second metal layer is disposed on the first metal layer, and an insulating layer is interposed between the first and second metal layers. The sensing lines include first and second sensing lines. The first and second sensing lines include the first and second metal layers in the first area. The first sensing line includes the first metal layer without the second metal layer in the second area, and the second sensing line includes the second metal layer without the first metal layer in the second area.

20 Claims, 14 Drawing Sheets

Related U.S. Application Data continuation of application No. 17/157,508, filed on Jan. 25, 2021, now Pat. No. 11,422,664.

(56) References Cited

U.S. PATENT DOCUMENTS

| | | |
|---|---|---|
| 11,422,664 B2 | 8/2022 | Kim et al. |
| 2014/0110236 A1 | 4/2014 | Lee |
| 2016/0157325 A1* | 6/2016 | Cregg .................... H05B 47/11 315/155 |
| 2018/0182822 A1 | 6/2018 | Seo et al. |
| 2019/0074328 A1 | 3/2019 | Park |
| 2020/0083299 A1 | 3/2020 | Kim et al. |
| 2020/0089351 A1 | 3/2020 | Jeong et al. |
| 2020/0111843 A1* | 4/2020 | Han .................... G06F 3/04164 |
| 2021/0357057 A1 | 11/2021 | Kim et al. |
| 2022/0365623 A1 | 11/2022 | Kim et al. |

* cited by examiner

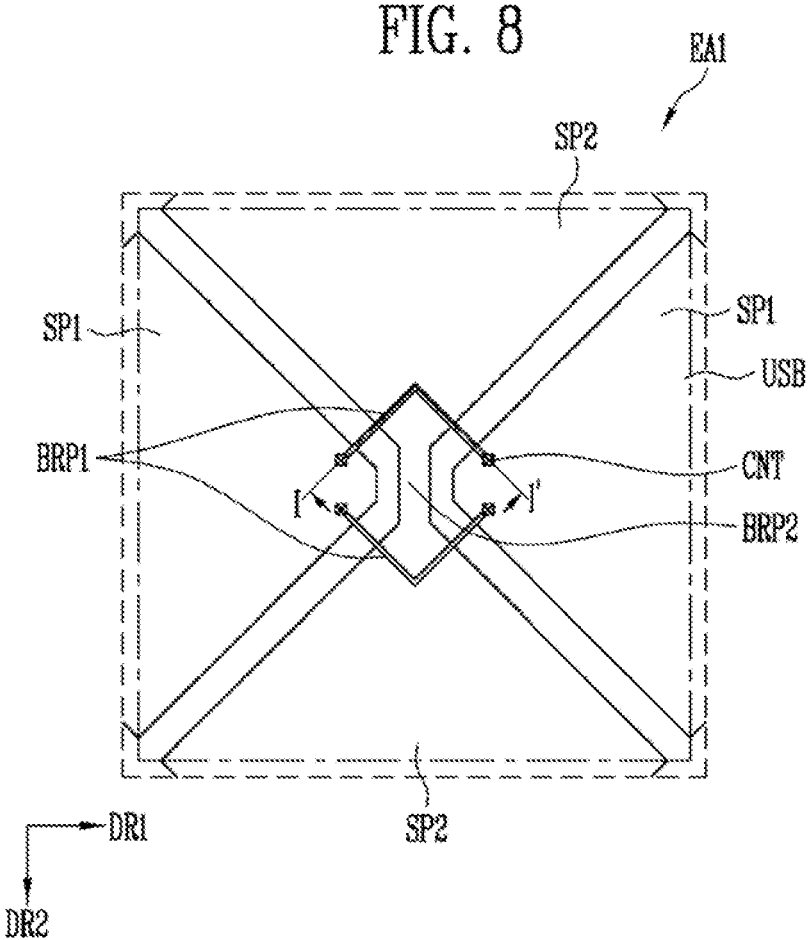
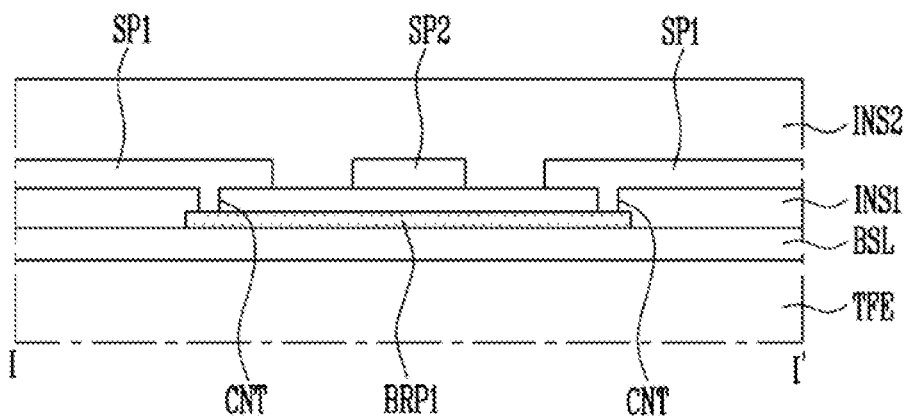

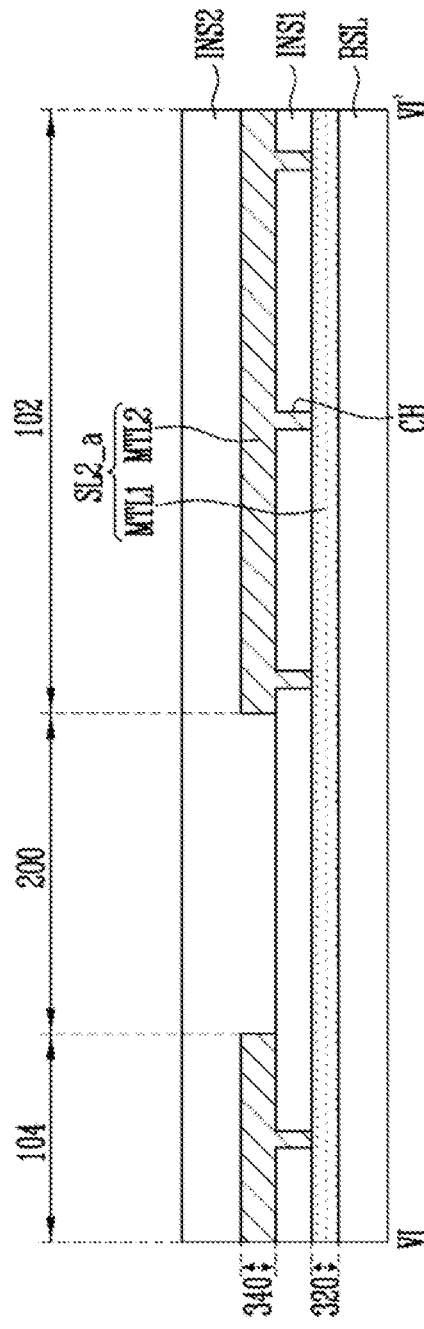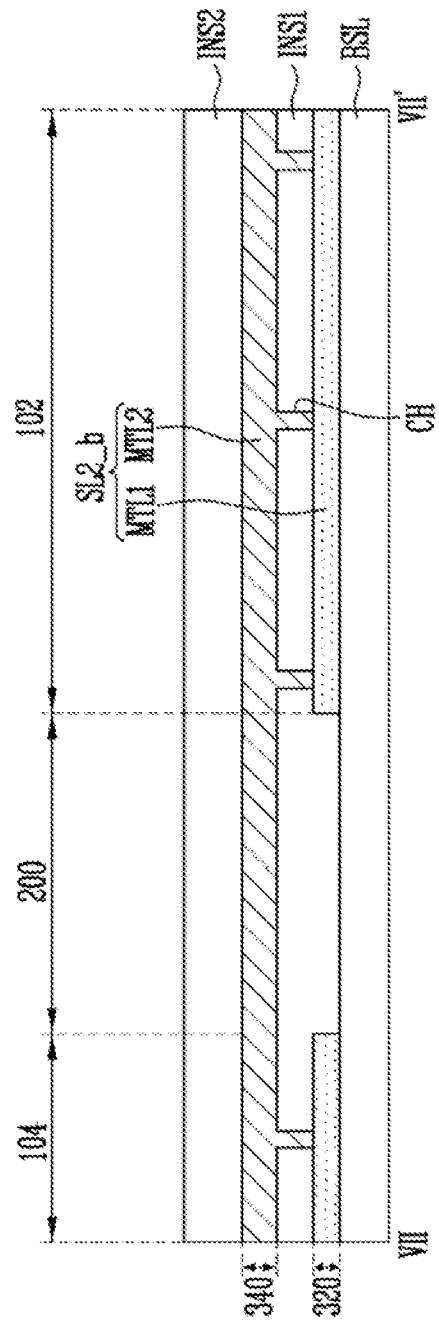

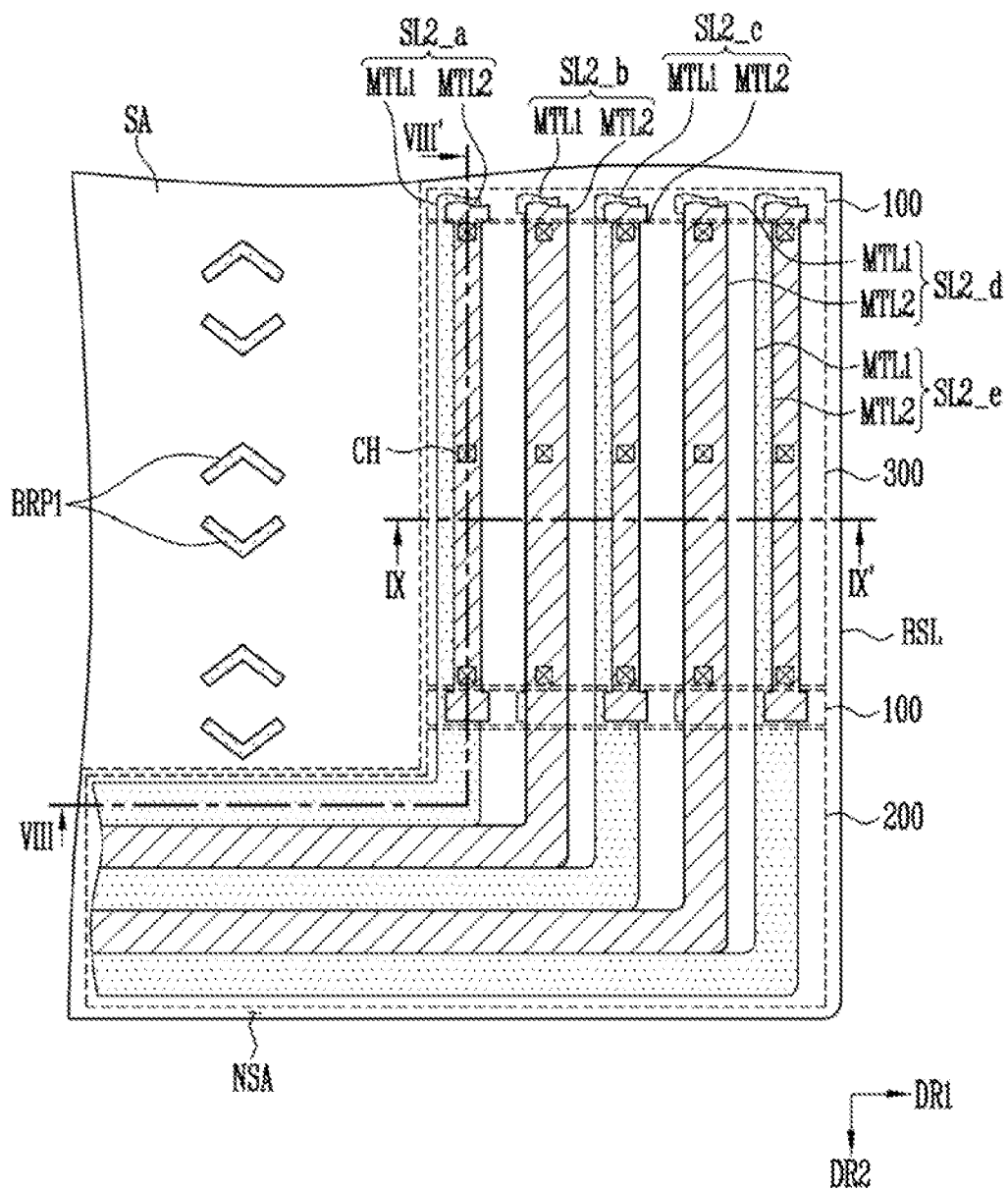

TOUCH SENSOR AND DISPLAY DEVICE INCLUDING THE SAME

CROSS-REFERENCE TO RELATED APPLICATION

The present application is a continuation of U.S. patent application Ser. No. 17/816,625, filed on Aug. 1, 2022 in the U.S. Patent and Trademark Office, which is a continuation of U.S. patent application Ser. No. 17/157,508, filed on Jan. 25, 2021 in the U.S. Patent and Trademark Office, which claims priority under 35 USC § 119 from, and the benefit of, Korean patent application number No. 10-2020-0057862, filed on May 14, 2020 in the Korean Intellectual Property Office, the contents of all of which are herein incorporated by reference in their entireties.

BACKGROUND

Technical Field

Various embodiments of the present disclosure are directed to a touch sensor and a display device that includes the touch sensor, and more particularly, to a touch sensor in which signal lines of at least some areas for a sensing electrode are arranged on a single layer, and a display device that includes the touch sensor.

Discussion of Related Art

Recently, a display device equipped with a touch sensor that is an input device capable of receiving touch input from a user has become widely used. When applying a touch input, the touch sensor obtains electrical information. The electrical information is provided to a controller of the display device along signal lines of the touch sensor.

In general, the signal lines are located along a periphery of a front display area to which visual data is output. However, the front display area of recently marketed display devices tends to be large. However, the required number of signal lines has increased, so that an area where the touch sensor signal lines may be located has gradually become smaller.

SUMMARY

Various embodiments of the present disclosure are directed to a touch sensor that has a structure in which signal lines are efficiently arranged and thereby a large number of signal lines can be located, and a display device including the touch sensor.

Furthermore, various embodiments of the present disclosure are directed to a touch sensor in which resistance values of signal lines are linear according to a position, and a display device including the touch sensor.

Embodiments of the present disclosure are not limited to the above-described objects, and other objects that are not mentioned will be clearly understood by those skilled in the art from the following description.

An embodiment of the present disclosure may provide a touch sensor, including a sensing electrode that receives a touch input and is disposed on a sensing area of a substrate; and a plurality of sensing lines disposed on a non-sensing area of the substrate, wherein each of the plurality of sensing lines includes a first area and a second area, and wherein each of the plurality of sensing lines includes a first metal layer and a second metal layer electrically coupled to the sensing electrode, the second metal layer being disposed on the first metal layer, with an insulating layer being interposed between the first metal layer and the second metal layer, wherein the plurality of sensing lines includes a first sensing line and a second sensing line, wherein the first sensing line and the second sensing line each include the first metal layer and the second metal layer in the first area, and wherein the first sensing line includes the first metal layer without the second metal layer in the second area, and the second sensing line includes the second metal layer without the first metal layer in the second area.

The first metal layer and the second metal layer may be arranged on different layers each other.

The first metal layer of the first sensing line might not overlap the second metal layer of the second sensing line, in the second area, when viewed from above.

The first metal layer of the first sensing line may overlap the second metal layer of the second sensing line, in the second area, when viewed from above.

The second metal layer of the second sensing line may overlap the first metal layer of the first sensing line by a first width in the second area, and the first width may be less than a width of the second metal layer.

The first sensing line and the second sensing line may be alternately disposed and adjacent to each other.

A width of the first metal layer of the first sensing line may be equal to a width of the second metal layer of the second sensing line.

A thickness of the second metal layer may be greater than a thickness of the first metal layer.

The first metal layer and the second metal layer may be electrically coupled to each other via a contact hole formed in the insulating layer.

The plurality of sensing lines may further include a third area, and the first sensing line and the second sensing line may include the first metal layer and the second metal layer in the third area, and a width of the second metal layer of the first sensing line in the third area may correspond to a width of the first metal layer of the first sensing line in the second area.

A width of the first metal layer of the second sensing line in the third area may correspond to a width of the second metal layer of the second sensing line in the second area.

The second metal layer of the first sensing line in the third area may have a first width, and the first metal layer of the first sensing line in the third area may have a second width that is greater than the first width.

The first metal layer of the second sensing line in the third area may have a first width, and the second metal layer of the second sensing line in the third area may have a second width that is greater than the first width.

The first area may be located between the second area and the third area.

Another embodiment of the present disclosure may provide a display device, including a substrate that includes a sensing area and a non-sensing area; a display panel disposed on the substrate and that includes a light-emitting element that emits light; and a touch sensor disposed on the display panel. The touch sensor includes a sensing electrode that receives a touch input and is disposed on the sensing area, and a plurality of sensing lines disposed on the non-sensing area and that include a first area and a second area. Each of the first area and second area includes a first metal layer and a second metal layer electrically coupled to the sensing electrode, where the second metal layer is disposed on the first metal layer with an insulating layer being interposed between the first metal layer and the second metal layer. The plurality of sensing lines includes a first sensing line and a second sensing line, where the first sensing line and the second sensing line include the first metal layer and the second metal layer in the first area, and where the first sensing line includes the first metal layer without the second metal layer in the second area, and the second sensing line includes the second metal layer without the first metal layer in the second area.

The first sensing line and the second sensing line may be alternately disposed and adjacent to each other.

The plurality of sensing lines may further include a third area, and the first sensing line and the second sensing line may each include the first metal layer and the second metal layer in the third area. A width of the second metal layer of the first sensing line in the third area may correspond to a width of the first metal layer of the first sensing line in the second area, and a width of the first metal layer of the second sensing line in the third area may correspond to a width of the second metal layer of the second sensing line in the second area.

The plurality of sensing lines may further include a third area, and the first sensing line and the second sensing line may each include the first metal layer and the second metal layer in the third area. The first metal layer of the first sensing line included in the third area and the second metal layer of the first sensing line may have different widths.

The first metal layer of the second sensing line included in the third area and the second metal layer of the second sensing line may have different widths.

Another embodiment of the present disclosure may provide a touch sensor that includes a plurality of sensing lines disposed on a substrate. Each of the plurality of sensing lines includes a first area and a second area, and each of the plurality of sensing lines includes a first metal layer and a second metal layer electrically coupled to a sensing electrode. The second metal layer is disposed on the first metal layer. The plurality of sensing lines includes a first sensing line and a second sensing line. The first sensing line and the second sensing line each include the first metal layer and the second metal layer in the first area, the first sensing line includes the first metal layer without the second metal layer in the second area, and the second sensing line includes the second metal layer without the first metal layer in the second area. The first sensing line and the second sensing line are alternately disposed and adjacent to each other on the substrate.

The present disclosure is not limited to the above-described embodiments, and other embodiments that are not mentioned will be clearly understood by those skilled in the art from the present specification and the accompanying drawings.

BRIEF DESCRIPTION OF THE DRAWINGS

FIG. 8 is an enlarged plan view of area EA1 of FIG. 7.

FIG. 9 is a sectional view taken along line I-I' of FIG. 8.

FIG. 17 is a sectional view taken along line VI-VI' of FIG. 16.

FIG. 18 is a sectional view taken along line VII-VII' of FIG. 16.

FIG. 19 schematically illustrates a touch sensor in accordance with an embodiment of the present disclosure, in which at least a portion of a sensing line has a resistance compensation structure.

DETAILED DESCRIPTION

Since exemplary embodiments described herein are intended to clearly convey the spirit of the present disclosure to those skilled in the art, embodiments of the present disclosure are not limited to exemplary embodiments. Various changes and modifications may be made in exemplary embodiments of the present disclosure without departing from the spirit and scope thereof.

The accompanying drawings are for the purpose of easily describing particular embodiments, and may be exaggerated as necessary to aid in understanding of the present disclosure.

When it is determined that the detailed description of the known art related to the present disclosure may obscure the gist of the present disclosure, the detailed description will be omitted.

Various embodiments of the present disclosure are directed to a touch sensor and a display device that includes the touch sensor, and more particularly, to a touch sensor in which signal lines of at least some areas for a sensing electrode are arranged on a single layer, and a display device including the touch sensor.

Hereinafter, a touch sensor and a display device that includes the touch sensor in accordance with an embodiment of the present disclosure will be described with reference to FIGS. 1 to 21.

Figure 1:
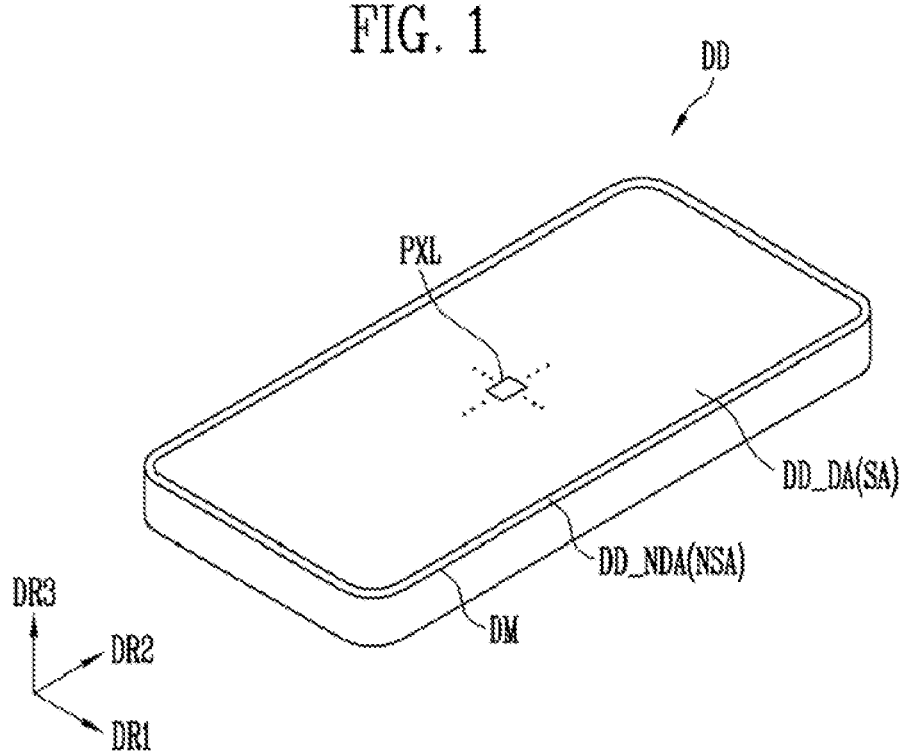
FIG. 1 is a diagram of a display device that includes a touch sensor in accordance with an embodiment of the present disclosure.

FIG. 1 is a diagram of a display device that includes a touch sensor in accordance with an embodiment of the present disclosure.

According to an embodiment, a display device DD provides visual data to a user. The display device DD may be any device that includes a light-emitting element that emits light when receiving an electrical signal. In other words, the display device DD in accordance with an embodiment of the present disclosure is not limited to a specific applicable object such as a tablet PC, a television, a smartphone, or a laptop computer.

In an embodiment, the display device DD includes a display module DM, a display area DA, a non-display area NDA, a sensing area SA, a non-sensing area NSA, and a pixel PXL. In FIG. 1, the display area DA and sensing area SA are indicted by the label DD_DA(SA), and the non-display area NDA and non-sensing area SA are indicted by the label DD_NDA(NSA).

The display area DA and the non-display area NDA are physically separated.

The display module DM includes a display area DA, a non-display area NDA, a sensing area SA, and a non-sensing area NSA.

In an embodiment, the display module DM not only displays an image through the sensing area SA but also senses touch input received from a user or light incident thereon. The touch sensor of the display device DD is located in the sensing area SA.

In an embodiment, the touch sensor of the display device DD is not located in the non-sensing area NSA. The non-sensing area NSA encloses the sensing area SA. However, this is merely illustrative, and embodiments of the present disclosure are not limited thereto.

In an embodiment, a portion of the display area DA corresponds to the sensing area SA. A portion of the non-display area NDA corresponds to the non-sensing area NSA.

In an embodiment, the display module DM outputs visual data from the front of the display device DD. The display module DM includes at least one pixel PXL. The pixel PXL is located in the display area DA.

In an embodiment, the pixel PXL includes a light-emitting element. The light-emitting element includes a material that serves as a light source that emits light when receiving an electrical signal. When an electrical signal that corresponds to image data that is to be output is received, the pixel PXL emits light that is output through the display area DA.

The light-emitting element may be an inorganic light-emitting element that includes an inorganic light emitting material, or a light-emitting element such as a quantum dot display element that emits light while changing the wavelength of the emitted light. For convenience of explanation, an embodiment will be described in terms of a light-emitting element is an organic light-emitting element that includes an organic light emitting material, however, it is to be understood that embodiments are not limited thereto.

In an embodiment, the display area DA is an area in which visual data is displayed. The display area DA is where the pixel PXL is located.

The non-display area NDA is an area in which no pixels PXL are located.

In an embodiment, when viewed from above, the non-display area NDA and the display area DA do not overlap each other. For instance, the non-display area NDA encloses an outer surface of the display area DA.

In an embodiment, the non-display area NDA includes a line area, a pad area, or a dummy area.

Figure 2:
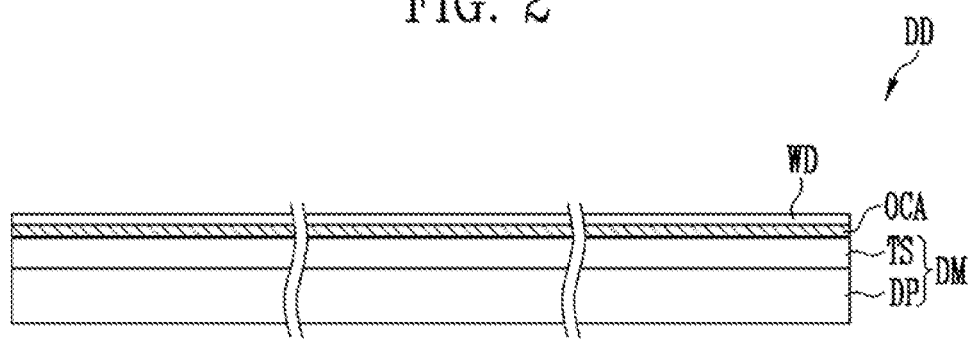
FIG. 2 is a sectional view of a structure of a display module that includes a touch sensor in accordance with an embodiment of the present disclosure.

FIG. 2 is a sectional view of a structure of a display module that includes a touch sensor in accordance with an embodiment of the present disclosure.

Referring to FIG. 2, a display device DD in accordance with an embodiment of the present disclosure includes a display module DM that includes a display panel DP and a touch sensor TS, an optically clear adhesive member OCA, and a window WD.

The display panel DP outputs visual data. A display panel according to an embodiment may be any one of a self-emissive display panel, such as an organic light emitting display panel that uses an organic light emitting diode (OLED) as the light-emitting element, a nano-scale LED display panel that uses a nano-scale light emitting diode as the light-emitting element, or a quantum dot organic light emitting display (QD OLED) panel that uses a quantum dot and an organic light emitting diode, etc. However, embodiments of the present disclosure are not limited to the above-described examples, and in other embodiments, the display panel DP may be at least one of a liquid crystal display (LCD) panel, an electrophoretic display (EPD) panel, or an electro-wetting display (EWD) panel.

Hereinafter, for convenience, a light-emitting element in the display device DD will be described in terms of an organic light emitting diode.

In an embodiment, the touch sensor TS is disposed on the display panel DP. The touch sensor TS is located in the sensing area SA (see FIG. 1).

In an embodiment, when receiving a touch input from a user, the touch sensor TS acquires information about the touch input. The touch sensor TS recognizes a touch input using a capacitive sensing method. The touch sensor TS may sense a touch input in a mutual capacitance method, or sense a touch input in a self-capacitance method.

In an embodiment, the window WD is disposed on the display module DM. The window WD is a transparent light-transmitting substrate. The window WD and the display module DM are coupled to each other via the optically clear adhesive member OCA. The window WD can mitigate external impacts on the display device DD while transmitting visual data.

Figure 3:
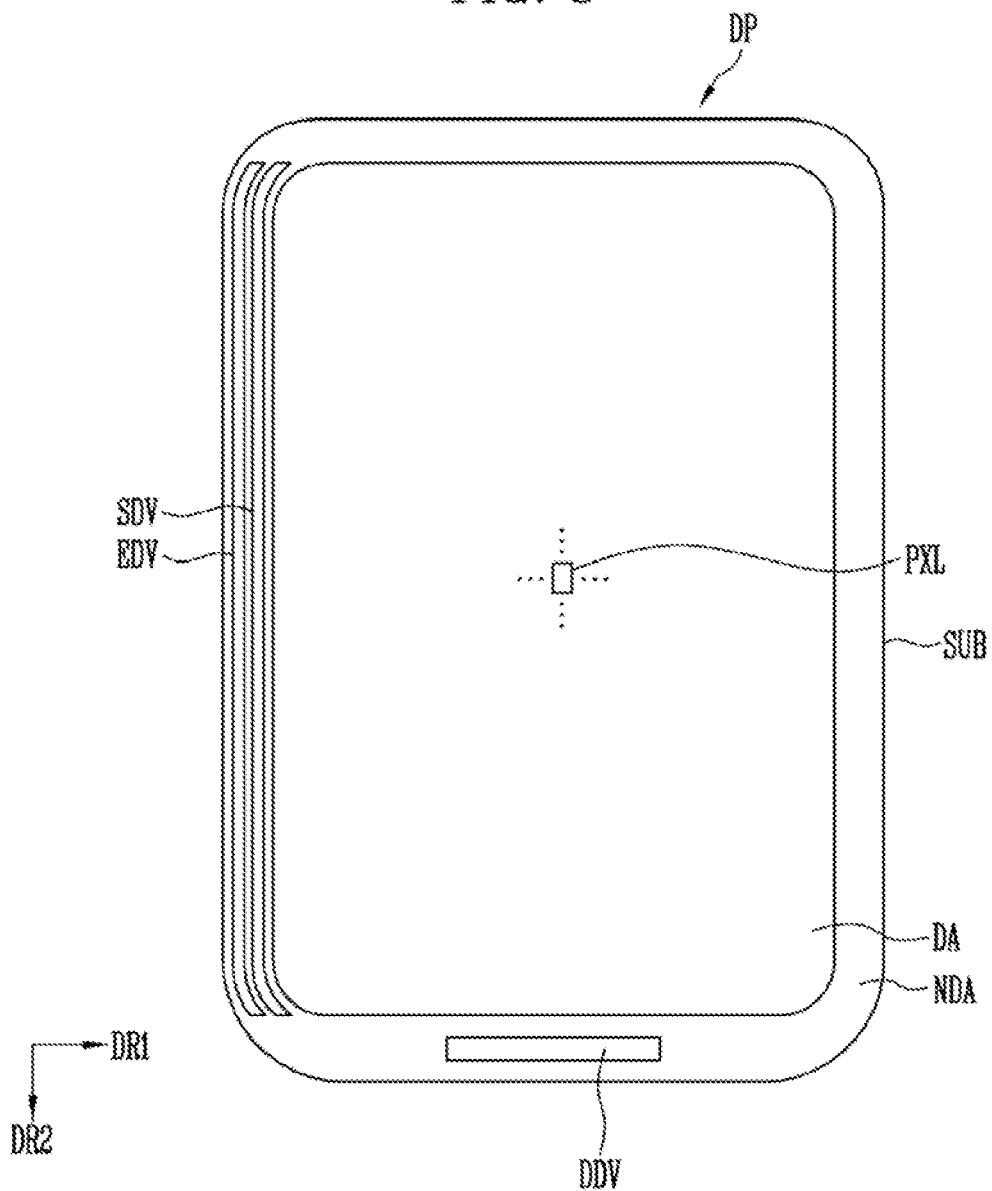
FIG. 3 schematically illustrates a display panel that includes a touch sensor in accordance with an embodiment of the present disclosure.

FIG. 3 schematically illustrates a display panel that includes a touch sensor in accordance with an embodiment of the present disclosure.

Referring to FIG. 3, in an embodiment, the display panel DP includes a substrate SUB, a pixel PXL, a driver, and a line component. The driver controls a scan driver SDV, an emission driver EDV, and a data driver DDV.

In an embodiment, the substrate SUB includes a display area DA and a non-display area NDA.

In an embodiment, the pixel PXL is located on the substrate SUB. The pixel PXL is located in the display area DA. The pixel PXLs are arranged in a matrix form along rows that extending in a first direction DR1 and columns that extend in a second direction DR2. The display area DA forms a plane defined by the first direction DR1 and second direction DR2, and projects an image in a third direction DR3 that is normal to the plane of the first and second directions DR1 and DR2.

In an embodiment, the scan driver SDV, the emission driver EDV, the data driver DDV, and the line components are located in the non-display area NDA.

The substrate SUB may include a rigid material or a flexible material, depending on the purpose of the display device DD. However, the material of the substrate SUB incorporated in an embodiment of the present disclosure is not limited to a specific material.

In an embodiment, when viewed from above, the driver is located in the non-display area NDA. The driver outputs electrical information to the pixel PXL. When the pixel PXL receives the electrical information, the light-emitting element in the pixel PXL emits light.

The scan driver SDV transmits a scan signal to the pixel PXL along a scan line.

The emission driver EDV transmits an emission control signal to the pixel PXL along an emission control line.

The data driver DDV transmits a data signal to the pixel PXL along a data line.

When viewed from above, the line components are located in the non-display area NDA. The line components electrically couple the driver with the pixel PXL.

Figure 4:
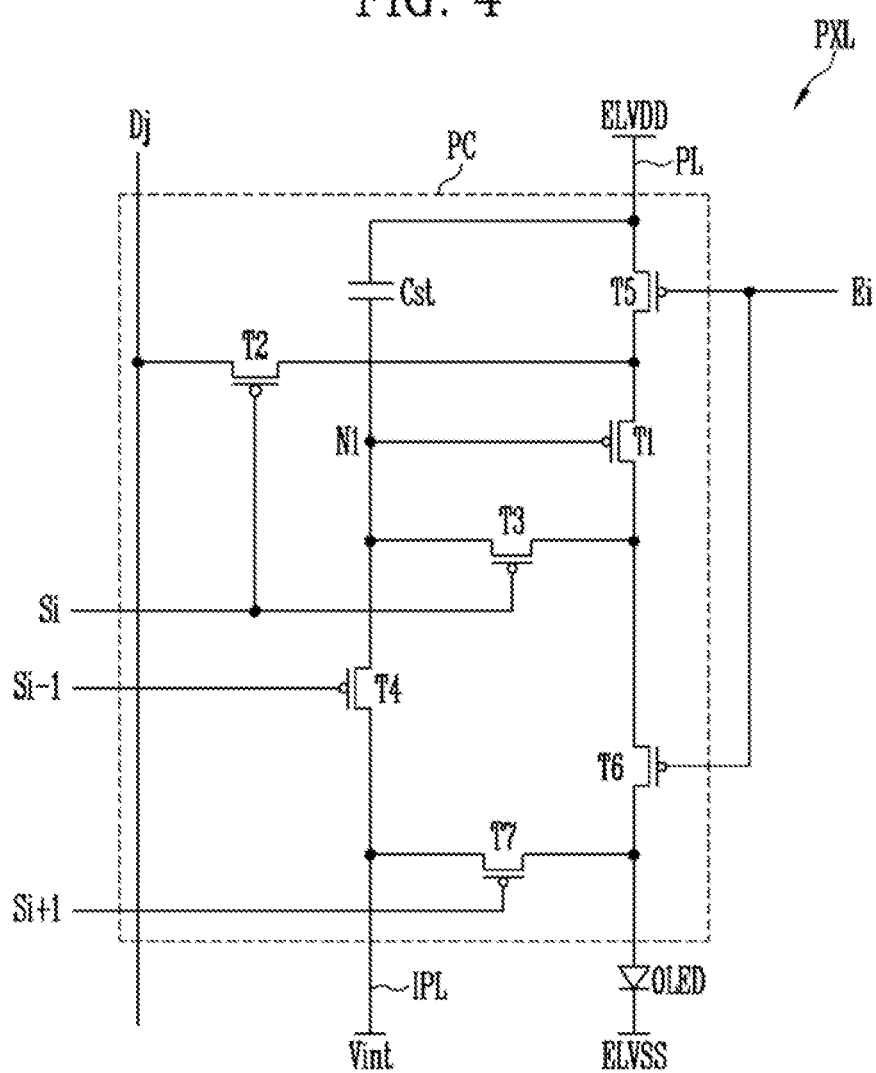
FIG. 4 illustrates a pixel driving circuit of each pixel in a display device that includes a touch sensor in accordance with an embodiment of the present disclosure.

FIG. 4 illustrates a pixel driving circuit PC of each pixel PXL provided in a display device that includes a touch sensor in accordance with an embodiment of the present disclosure.

Each pixel PXL in a display device that includes a touch sensor in accordance with an embodiment of the present disclosure includes the pixel driving circuit PC.

In an embodiment, the pixel driving circuit PC includes first to seventh transistors T1 to T7, and a storage capacitor Cst. The pixel driving circuit PC is electrically coupled to the organic light emitting diode OLED.

In an embodiment, a first electrode of the first transistor T1 is coupled to a first power supply ELVDD via the fifth transistor T5, and a second electrode of the first transistor T1 may be coupled to an anode electrode of the organic light emitting diode OLED via the sixth transistor T6. The first transistor T1 controls, on the basis of voltage information of a first node N1, data of a current flowing from the first power supply ELVDD to a second power supply ELVSS via the organic light emitting diode OLED. The first transistor T1 is a driving transistor.

In an embodiment, the second transistor T2 is coupled between a j-th data line Dj and the first electrode of the first transistor T1. A gate electrode of the second transistor T2 is coupled to an i-th scan line Si. When the scan signal is received from the i-th scan line Si, the second transistor T2 is turned on so that the first electrode of the first transistor T1 becomes electrically coupled with the j-th data line Dj. The second transistor T2 is a switching transistor.

In an embodiment, the third transistor T3 is coupled between the second electrode of the first transistor T1 and the first node N1. When a scan signal of a gate-on voltage is received from the i-th scan line Si, the third transistor T3 is turned on so that the second electrode of the first transistor T1 is electrically coupled with the first node N1. Consequently, when the third transistor T3 is turned on, the first transistor T1 is connected in the form of a diode.

In an embodiment, the fourth transistor T4 is coupled between the first node N1 and an initialization power supply line IPL to which an initialization power supply Vint is applied. A gate electrode of the fourth transistor T4 may be coupled to an i−1-th scan line Si−1. When a scan signal is received from the i−1-th scan line Si−1, the fourth transistor T4 is turned on so that the voltage of the initialization power supply Vint is supplied to the first node N1. The fourth transistor T4 is an initialization transistor.

In an embodiment, the fifth transistor T5 is coupled between a power supply line PL from which the first power supply ELVDD is received and the first transistor T1. A gate electrode of the fifth transistor T5 is coupled to an i-th emission control line Ei. The fifth transistor T5 is turned off when an emission control signal, such as a high level voltage, of a gate-off voltage is received from the i-th emission control line Ei, and is turned on in the other cases.

In an embodiment, the sixth transistor T6 is coupled between the first transistor T1 and the organic light emitting diode OLED. A gate electrode of the sixth transistor T6 is coupled to the i-th emission control line Ei. The sixth transistor T6 is turned off when an emission control signal of a gate-off voltage is received from the i-th emission control line Ei, and is turned on in the other cases.

In an embodiment, the seventh transistor T7 is coupled between the initialization power supply line IPL and the first electrode of the organic light emitting diode OLED. For example, the first electrode may be an anode electrode. A gate electrode of the seventh transistor T7 is coupled to an i+1-th scan line Si+1. When a scan signal of a gate-on voltage, such as a low level voltage, is received from the i+1-th scan line Si+1, the seventh transistor T7 is turned on so that the voltage of the initialization power supply Vint is supplied to the anode electrode of the organic light emitting diode OLED. A signal applied to the gate electrode of the seventh transistor T7 has the same timing as the scan signal of the gate-on voltage applied from the i-th scan line Si.

In an embodiment, the voltage of the initialization power supply Vint is set to a voltage lower than that of a data signal. For example, the voltage of the initialization power supply Vint is set to be equal to or less than a minimum voltage of the data signal.

In an embodiment, the storage capacitor Cst is coupled between the power supply line PL through which the first power supply ELVDD is received and the first node N1. The storage capacitor Cst stores a voltage that corresponds both to a data signal and a threshold voltage of the first transistor T1.

In an embodiment, the anode electrode of the organic light emitting diode OLED is coupled to the first transistor T1 via the sixth transistor T6. A cathode electrode of the organic light emitting diode OLED is coupled to the second power supply ELVSS.

In an embodiment, the organic light-emitting diode OLED emits light having a luminance that corresponds to a current received from the first transistor T1. The voltage of the first power supply ELVDD is set to a value higher than the voltage of the second power supply ELVSS so as to allow current to flow to the organic light-emitting diode OLED.

In an embodiment, the organic light-emitting diode OLED is the above-mentioned organic light-emitting diode. The organic light-emitting diode OLED emits light of at least one of red, green, blue, and white.

Although FIG. 4 illustrates that the pixel PXL is driven using signals of the i-th scan line Si, the i−1-th scan line Si−1, and the i+1-th scan line Si+1, embodiments of the present disclosure are not limited thereto. For instance, the the i-th scan line Si, the i−1-th scan line Si−1, and the i+1-th scan line Si+1 may be distinct signal lines that receive scan signals from different scan drivers SDV, respectively.

Hereinafter, a structure of a display device that includes a touch sensor in accordance with an embodiment of the present disclosure will be described in detail with reference to FIG. 5.

Figure 5:
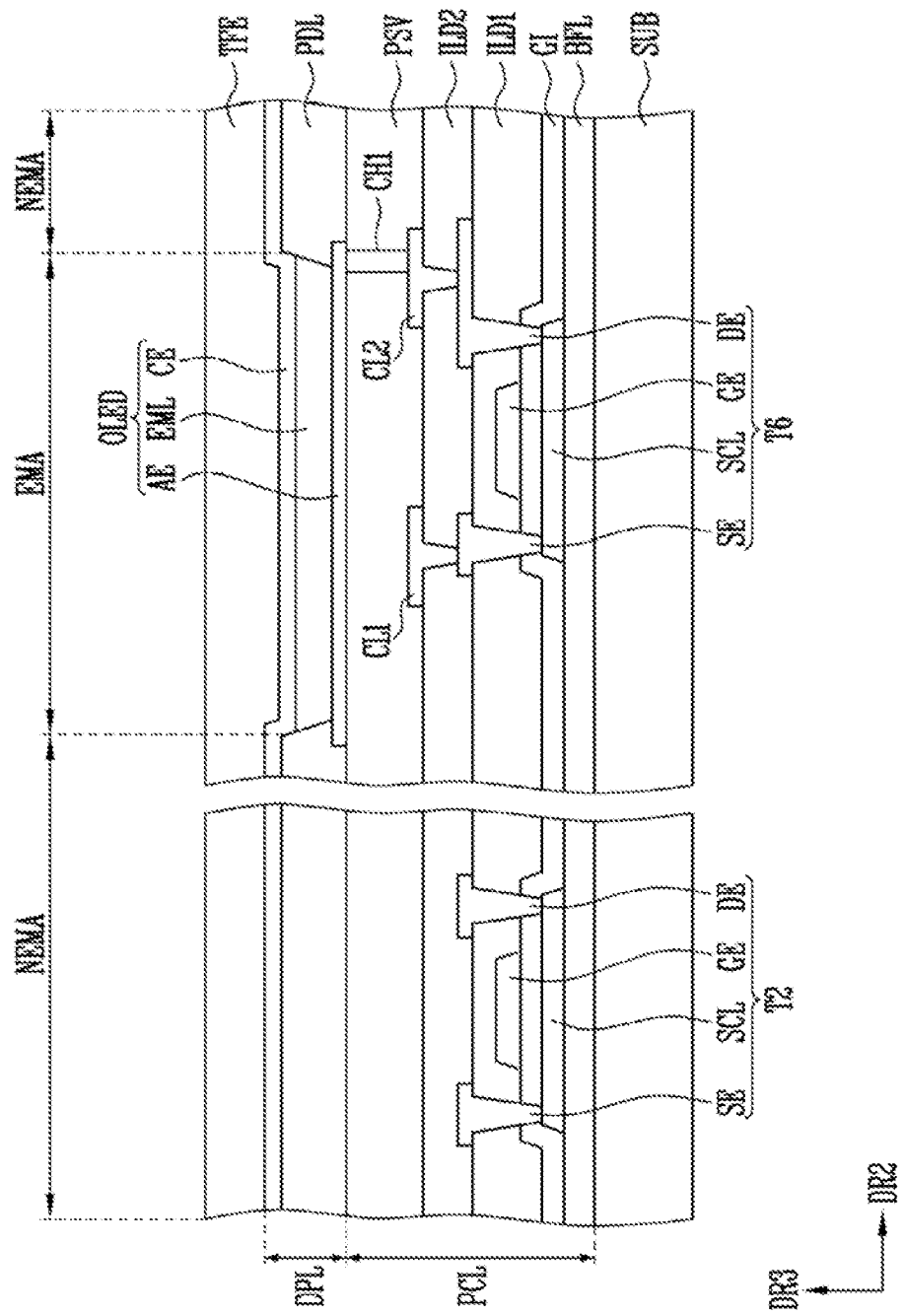
FIG. 5 is a sectional view of a display device that includes a touch sensor in accordance with an embodiment of the present disclosure.

FIG. 5 is a sectional view of a display device that includes a touch sensor in accordance with an embodiment of the present disclosure. FIG. 5 shows the structure of a display device when viewing the display device of FIG. 1 in the first direction DR1.

For the convenience of explanation, FIG. 5 illustrates cross sections of portions corresponding to the second transistor T2 and the sixth transistor T6 of the first to seventh transistors T1 to T7 illustrated in FIG. 4.

The display device DD in accordance with an embodiment of the present disclosure includes a substrate SUB, component pixel circuit unit PCL, a light-emitting-element unit DPL, and a thin-film encapsulation layer TFE.

The substrate SUB may include a rigid material or a flexible material, depending on the purpose of the display device DD. A flexible material may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, cellulose triacetate, or cellulose acetate propionate. However, the material of the substrate SUB is not limited to the specific disclosed materials.

In an embodiment, the pixel circuit component PXL is located on the substrate SUB. The pixel circuit unit PCL includes a buffer layer BFL, a gate insulation layer GI, the second transistor T2, the sixth transistor T6, a first interlayer insulation layer ILD1, a second interlayer insulation layer ILD2, a first conductive line CL1, a second conductive line CL2, a first contact hole CH1, and a passivation layer PSV.

In an embodiment, the buffer layer BFL is disposed on the substrate SUB. The buffer layer BFL prevents impurities from diffusing into the sixth transistor T6 or the second transistor T2.

The buffer layer BFL may include at least one metal oxide, such as silicon nitride (SiNx), silicon oxide (SiOx), silicon oxynitride (SiON), or aluminum oxide (AlOx). However, in some embodiments, the buffer layer BFL is omitted.

In an embodiment, the second transistor T2 is located in a non-light-emitting area NEMA, and the sixth transistor T6 is located in a light-emitting area EMA. However, embodiments of the present disclosure are not limited thereto. According to another embodiment, the second transistor T2 is located in the light-emitting area EMA.

In an embodiment, each of the second and sixth transistors T2 and T6 includes a semiconductor pattern SCL, a source electrode SE, a drain electrode DE, and a gate electrode GE.

In an embodiment, the semiconductor pattern SCL is disposed on the buffer layer BFL.

The semiconductor pattern SCL is a semiconductor layer. According to an embodiment, the semiconductor pattern SCL includes at least one of polysilicon, amorphous silicon or an oxide semiconductor.

In an embodiment, the semiconductor pattern SCL includes a first contact area in contact with the source electrode SE, and a second contact area in contact with the drain electrode DE.

In an embodiment, each of the first and second contact areas is a semiconductor pattern doped with impurities. An area between the first contact area and the second contact area is a channel area. The channel area is an intrinsic semiconductor pattern undoped with impurities.

In an embodiment, a gate insulating layer GI is disposed on the semiconductor pattern SCL and the buffer layer BFL. The gate insulating layer GI includes an inorganic material. For example, the gate insulating layer GI includes at least one of silicon nitride (SiNx), silicon oxide (SiOx), silicon oxynitride (SiON), or aluminum oxide (AlOx). In another embodiment, the gate insulating layer GI includes an organic material.

In an embodiment, a gate electrode GE may be located on the gate insulating layer GI.

A position of the gate electrode GE corresponds to a position of the channel area of the semiconductor pattern SCL. For example, the gate electrode GE is disposed on the channel area of the semiconductor pattern SCL with the gate insulating layer GI being interposed therebetween.

In an embodiment, a first interlayer insulating layer ILD1 is disposed on the gate electrode GE and the gate insulating layer GI. Similar to the gate insulating layer GI, the first interlayer insulating layer ILD1 includes at least one of silicon nitride (SiNx), silicon oxide (SiOx), silicon oxynitride (SiON), or aluminum oxide (AlOx).

In an embodiment, the source electrode SE and the drain electrode DE are disposed on the first interlayer insulating layer ILD1. The source electrode SE penetrates the gate insulting layer GI and the first interlayer insulating layer ILD1 to come into contact with the first contact area of the semiconductor pattern SCL, while the drain electrode DE penetrates the gate insulting layer GI and the first interlayer insulating layer ILD1 to come into contact with the second contact area of the semiconductor pattern SCL.

In an above-described embodiment, the source electrode SE and the drain electrode DE of each of the second and sixth transistors T2 and T6 are described as separate electrodes that penetrate the gate insulating layer GI and the first interlayer insulating layer ILD1 to be electrically coupled to the semiconductor patterns SCL of corresponding transistors. However, embodiments of the present disclosure are not limited thereto. In another embodiment, the source electrode SE of each of the second and sixth transistors T2 and T6 is one of the first and second contact areas adjacent to the channel area of the semiconductor pattern SCL of a corresponding transistor, and the drain electrode DE of each of the second and sixth transistors T2 and T6 is the remaining contact area adjacent to the channel area of the semiconductor pattern SCL. In this case, the drain electrode DE of each of the second and sixth transistors T2 and T6 is electrically coupled to some components of the light-emitting-element unit DPL through a separate coupling component that includes a contact electrode, etc.

In an embodiment, a second interlayer insulating layer ILD2 is disposed on the source electrode SE and the drain electrode DE and the first interlayer insulating layer ILD1. Similar to the first interlayer insulating layer ILD1 and the gate insulating layer GI, the second interlayer insulating layer ILD2 includes an inorganic material. The inorganic material includes any of the materials that form the first interlayer insulating layer ILD1 and the gate insulating layer GI, such as at least one of silicon nitride (SiNx), silicon oxide (SiOx), silicon oxynitride (SiON), or aluminum oxide (AlOx). In another embodiment, the second interlayer insulating layer ILD2 includes an organic material.

In an embodiment, the first conductive line CL1 is disposed on the second interlayer insulating layer ILD2, and is electrically coupled to the source electrode SE through a contact hole that penetrates the second interlayer insulating layer ILD2.

In an embodiment, the second conductive line CL2 is disposed on the second interlayer insulating layer ILD2, and is electrically coupled to the drain electrode DE through the contact hole that penetrates the second interlayer insulating layer ILD2.

In an embodiment, the first and second conductive lines CL1 and CL2 are paths through which an electrical signal can flow. In particular, the second conductive line CL2 is a bridge electrode that electrically couples the drain electrode DE of the sixth transistor T6 with other components of the light-emitting-element unit DPL. According to an embodiment, each of the first and second conductive lines CL1 and CL2 includes at least one of molybdenum (Mo), tungsten (W), aluminum-neodymium (AlNd), titanium (Ti), aluminum (Al), or silver (Ag).

In an embodiment, the passivation layer PSV is disposed on the first and second conductive lines CL1 and CL2 and the second interlayer insulating layer ILD2. The passivation layer PSV includes an organic insulating layer or an inorganic insulating layer, or an organic insulating layer disposed on an inorganic insulating layer.

In an embodiment, the passivation layer PSV includes a first contact hole CH1 that exposes an area of the second conductive line CL2.

The first contact hole CH1 provides a path through which an electrical signal received from the sixth transistor T6 can be transmitted.

In an embodiment, the light-emitting-element unit DPL includes a pixel defining layer PDL and an organic light-emitting diode OLED.

The pixel defining layer PDL defines a location where the organic light-emitting diode OLED is disposed.

In an embodiment, the pixel defining layer PDL includes an organic material. For example, the pixel defining layer PDL includes at least one of acryl resin, epoxy resin, phenolic resin, polyamide resin, or polyimide resin.

The organic light-emitting diode OLED includes a first electrode AE, a light emitting layer EML, and a second electrode CE. The organic light-emitting diode OLED is located on the passivation layer PSV in the display area DA.

Here, a light-emitting layer EML of the organic light-emitting diode OLED is located in the light-emitting area EMA. The light-emitting layer EML of the organic light-emitting diode OLED is not located in the non-light-emitting area NEMA.

Here, one of the first and second electrodes AE and CE is an anode electrode, and the other is a cathode electrode. When the OLED is a top-emission type OLED, the first electrode AE is a reflective electrode, and the second electrode CE is a transmissive electrode. Hereinafter, the OLED is described in terms of the top-emission type OLED and the first electrode AE is the anode electrode. However, embodiments of the disclosure are no limited thereto, and in other embodiments, the OLED can be a bottom-emission type OLED.

In an embodiment, the first electrode AE is disposed on the passivation layer PSV in the display area DA. The first electrode AE is electrically coupled to the second conductive line CL2 through the first contact hole CH1. The first electrode AE includes a reflective layer that reflects light, or a transparent conductive layer that is disposed on or under the reflective layer. For example, the first electrode AE may have a multi-layer structure that includes a lower transparent conductive layer made of indium tin oxide (ITO), a reflective layer provided on the lower transparent conductive layer and made of silver, and an upper transparent conductive layer provided on the reflective layer and made of indium tin oxide (ITO). At least one of the transparent conductive layer and the reflective layer is electrically coupled to the drain electrode DE of the sixth transistor T6 through the first contact hole CH1 of the passivation layer PSV.

In an embodiment, the light-emitting layer EML is disposed in an area exposed by an opening in the pixel defining layer PDL. The light-emitting layer EML defines the light-emitting area EMA from which light is emitted. The light-emitting layer EML includes an organic material.

To be more specific, in an embodiment, the light emitting layer EML has a multi-layer thin film structure that includes at least a light generation layer. The light-emitting layer EML includes: a hole injection layer into which holes are injected; a hole transport layer that has excellent hole transportation performance and restrains movement of electrons that are not coupled with holes in the light generation layer and thus increases chances of recombination between holes and electrons; the light generation layer that emits light by recombination of the injected electrons and holes; a hole blocking layer that restrains movement of holes that are not coupled with electrons in the light generation layer; an electron transport layer through which electrons are transported to the light generation layer; and an electron injection layer into which electrons are injected. As described above, when an electrical signal is applied to the light-emitting layer EML, light is emitted. The color of light generated from the emission layer EML is one of red, green, blue or white, but embodiments of the present disclosure are not limited thereto. In another embodiment, the color of light generated from the emission layer EML is one of magenta, cyan, or yellow.

In an embodiment, the second electrode CE is disposed on the light-emitting layer EML and the pixel defining layer. Although the second electrode CE may be provided on the display area DA in the form of a plate, embodiments of the present disclosure are not limited thereto. The second electrode CE includes a transparent conductive material such as a transparent conductive oxide that is one of indium tin oxide (ITO), indium zinc oxide (IZO), aluminum zinc oxide (AZO), gallium doped zinc oxide (GZO), zinc tin oxide (ZTO), gallium tin oxide (GTO), or fluorine doped tin oxide (FTO). In an embodiment, when the OLED is a bottom emission type OLED, the second electrode CE includes a translucent conductive material such as magnesium (Mg) or silver (Ag), or an alloy of magnesium (Mg) and silver (Ag).

In an embodiment, the thin-film encapsulation layer TFE is disposed on the second electrode CE. The thin-film encapsulation layer TFE includes a plurality of insulating layers that cover the OLED. In detail, the thin-film encapsulation layer TFE includes at least one inorganic layer or at least one organic layer. For example, the thin-film encapsulation layer TFE has a structure formed by alternately stacking inorganic layers and organic layers.

Figure 6:
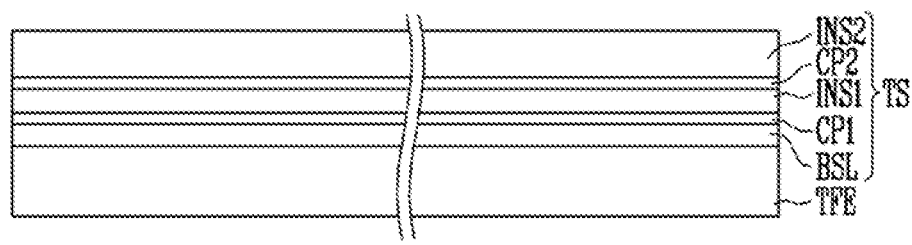
FIG. 6 is a sectional view of a touch sensor in accordance with an embodiment of the present disclosure.

FIG. 6 is a sectional view of a touch sensor in accordance with an embodiment of the present disclosure.

Referring to FIG. 6, in an embodiment, the touch sensor TS includes a base layer BSL, a first conductive pattern CP1, a first insulating layer INS1, a second conductive pattern CP2, and a second insulating layer INS2.

In an embodiment, the base layer BSL is an insulating layer, and is located on the thin-film encapsulation layer TFE.

The first conductive pattern CP1 is disposed on the base layer BSL.

The first insulating layer INS1 is disposed on the first conductive pattern CP1.

The second conductive pattern CP2 is disposed on the first insulating layer INS1.

The second insulating layer INS2 is disposed on the second conductive pattern CP2.

However, in another embodiment, the base layer BSL is omitted. In this case, the first conductive pattern CP1 is disposed on the thin-film encapsulation layer TFE.

In an embodiment, one or both of the first conductive pattern CP1 or the second conductive pattern CP2 is formed as a single layer. In this case, one or both of the first conductive pattern CP1 or the second conductive pattern CP2 includes a metal layer or a transparent conductive layer. For example, the metal layer includes one or more of molybdenum, silver, titanium, copper, or aluminum, or an alloy of them. The transparent conductive layer includes a transparent conductive oxide such as one or more of indium tin oxide (ITO), indium zinc oxide (IZO), zinc oxide (ZnO), or indium tin zinc oxide (ITZO). In addition, the transparent conductive layer may include one or more of PEDOT, metal nanowires, or graphene.

In an embodiment, one or both of the first conductive pattern CP1 or the second conductive pattern CP2 is formed as multiple layers. In this case, one or both of the first conductive pattern CP1 or the second conductive pattern CP2 includes multiple metal layers. For example, the multiple metal layers may be a three-layer structure of titanium/aluminum/titanium.

In an embodiment, each of the first insulating layer INS1 and the second insulating layer INS2 includes an inorganic material or an organic material. The inorganic material includes, for example, at least one of aluminum oxide, titanium oxide, silicon oxide, silicon nitride, silicon oxynitride, zirconium oxide, or hafnium oxide. The organic material includes at least one of an acrylic resin, a methacrylic resin, polyisoprene, a vinyl-based resin, an epoxy-based resin, a urethane-based resin, a cellulose-based resin, a siloxane-based resin, a polyimide-based resin, a polyamide-based resin, or a perylene-based resin.

Hereinafter, a touch sensor in accordance with an embodiment of the present disclosure will be described with reference to FIGS. 7 to 9.

Figure 7:
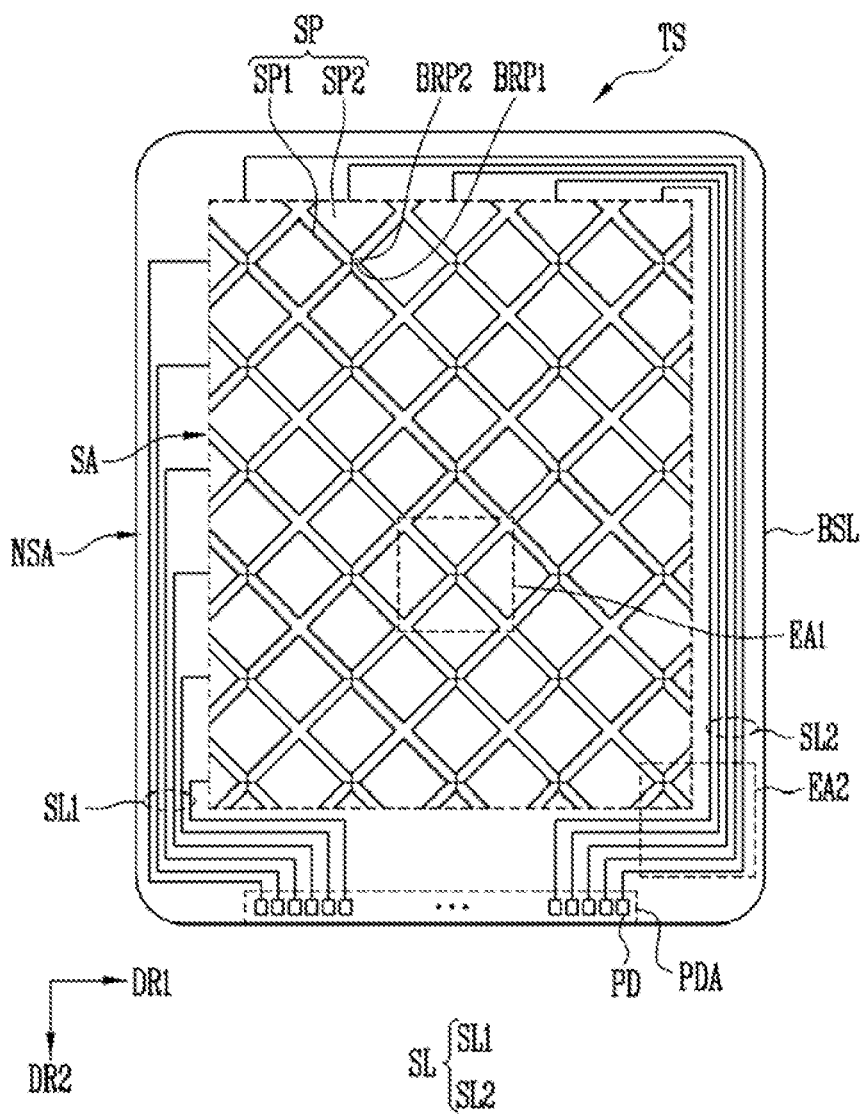
FIG. 7 is a plan view of a touch sensor in accordance with an embodiment of the present disclosure.

FIG. 7 is a plan view of a touch sensor in accordance with an embodiment of the present disclosure.

In an embodiment, the touch sensor TS includes a base layer BSL, a first sensing line SL1, and a second sensing line SL2.

In an embodiment, the base layer BSL includes a sensing area SA, a non-sensing area NSA, and a pad area PDA.

The base layer BSL may include reinforced glass, transparent plastics, or transparent films. According to an embodiment, the base layer BSL includes the same material as that of the substrate SUB of the display panel DP, which has been described above with reference to FIGS. 3 to 5.

In an embodiment, the sensing area SA is located in a central area of the base layer BSL and at least partially overlaps the display area DA of the display panel DP. A sensor electrode to which touch input may be applied is disposed in the sensing area SA.

In an embodiment, the non-sensing area NSA is located in a peripheral area of the base layer BSL and at least partially overlaps the non-display area NDA of the display panel DP. A sensing line SL is disposed in the non-sensing area NSA that is electrically coupled to the sensor electrode and can transmit electrical information about a touch input. The number of sensing lines SL is at least two or more. The sensing lines SL include the first sensing line SL1 and the second sensing line SL2.

In an embodiment, the pad area PDA is located in at least a portion of the non-sensing area NSA, and includes a pad PD that is electrically coupled to the sensing line SL. A plurality of pads PD may be provided.

In an embodiment, the sensor electrode includes a plurality of sensor patterns SP, a first bridge pattern BRP1, and a second bridge pattern BRP2.

In an embodiment, the plurality of sensor patterns SP include a plurality of first sensor patterns SP1 and a plurality of second sensor patterns SP2. The first sensor pattern SP1 is electrically coupled to the first sensing line SL1 and the pad PD. The second sensor pattern SP2 is electrically coupled to the second sensing line SL2 and the pad PD. The first sensor pattern SP1 and the second sensor pattern SP2 are located on the same layer. The plurality of first sensor patterns SP1 are arranged in the first direction DR1, and the plurality of second sensor patterns SP2 are arranged in the second direction DR2.

In an embodiment, the first sensor pattern SP1 and the second sensor pattern SP2 include a conductive material. The conductive material includes at least one of a metal, an alloy thereof, a conductive polymer, a conductive metal oxide, or a nano conductive material, but embodiments are not limited to the above-described materials.

The touch sensor TS in accordance with an embodiment of the present disclosure acquires information about a user's touch input, on the basis of a change in capacitance formed between the first sensor pattern SP1 and the second sensor pattern SP2.

In an embodiment, the first sensing lines SL1 are electrically coupled to the first sensor patterns SP1. Each of the first sensing lines SL1 is respectively electrically coupled to one sensor row of the plurality of first sensor patterns SP1. When viewed from above, the first sensing lines SL1 are bent at least once in the non-sensing area NSA. The first sensing lines SL1 include a portion that extends in the second direction DR2.

In an embodiment, the second sensing lines SL2 are electrically coupled to the second sensor patterns SP2. Each of the second sensing lines SL2 is respectively electrically coupled to one sensor column of the plurality of second sensor patterns SP2. When viewed from above, the second sensing lines SL2 are bent at least once in the non-sensing area NSA. The second sensing lines SL2 include a portion that extends in the first direction DR1.

Since the first sensing line SL1 and the second sensing line SL2 will be described below, a duplicated description thereof will be omitted herein.

FIG. 8 is an enlarged plan view of area EA1 of FIG. 7.

Referring to FIG. 8, in an embodiment, the first bridge pattern BRP1 electrically couples adjacent first sensor patterns SP1. The second bridge pattern BRP2 electrically couples adjacent second sensor patterns SP2. In an embodiment, the first bridge pattern BRP1 is integrally formed with the first sensor pattern SP1. Likewise, the second bridge pattern BRP2 is integrally formed with the second sensor pattern SP2.

In an embodiment, the touch sensor TS is formed by repeatedly arranging unit sensor blocks USB. The unit sensor block USB is a virtual unit block that has a predetermined area and that includes at least a portion of the neighboring first sensor pattern SP1 and at least a portion of the neighboring second sensor pattern SP2. The unit sensor block USB corresponds to a minimum repeating unit of an arrangement pattern of the first sensor pattern SP1 and the second sensor pattern SP2.

FIG. 9 is a sectional view taken along line I-I' of FIG. 8.

Referring to FIG. 9, in an embodiment, the base layer BSL is disposed on the thin-film encapsulation layer TFE. The base layer BSL may include an organic insulating layer that includes an organic material, or an inorganic insulating layer that includes an inorganic material. In another embodiment, the base layer BSL is omitted.

In an embodiment, the first bridge pattern BRP1 is disposed on the base layer BSL. The first insulating layer INS1 is disposed on the first bridge pattern BRP1. The first insulating layer INS1 includes substantially the same material as that of the base layer BSL, but is not limited thereto. The first bridge pattern BRP1 is included in the first conductive pattern CP1 that has been described above with reference to FIG. 6.

In an embodiment, the first sensor pattern SP1 is disposed on the first insulating layer INS1. The first sensor pattern SP1 is electrically coupled to the first bridge pattern BRP1 through a contact hole CNT. The first sensor pattern SP1 includes a conductive material. Although the conductive material may include a transparent conductive oxide or a metal, embodiments of the present disclosure are not limited to the above-described examples.

In an embodiment, the second sensor pattern SP2 is disposed on the first insulating layer INS1. Although the second sensor pattern SP2 includes a conductive material similar to that of the first sensor pattern SP1, embodiments of the present disclosure are not limited thereto. The second sensor pattern SP2 is coupled to the adjacent second sensor pattern SP2 through the second bridge pattern BRP2 that is integrated with the second sensor pattern SP2.

In an embodiment, the first and second sensor patterns SP1 and SP2 and the second bridge pattern BRP2 are included in the second conductive pattern CP2 that has been described above with reference to FIG. 6.

In an embodiment, the second insulating layer INS2 is disposed on the first insulating layer INS1 and covers the first and second sensor patterns SP1 and SP2. The second insulating layer INS2 protects the first and second sensor patterns SP1 and SP2 from external influences. The second insulating layer INS2 is flexible and can smooth and planarize any curvature of the underlying structures.

In an above-described embodiment, the first bridge pattern BRP1 is included in the first conductive pattern CP1, and the first and second sensor patterns SP1 and SP2 and the second bridge pattern BRP2 are included in the second conductive pattern CP2. However, embodiments of the present disclosure are not limited thereto. In another embodiment, the first and second sensor patterns SP1 and SP2 and the second bridge pattern BRP2 are included in the first conductive pattern CP1, and the first bridge pattern BRP1 is included in the second conductive pattern CP2.

Hereinafter, a sensing line of a touch sensor in accordance with an embodiment of the present disclosure will be described in detail with reference to FIGS. 10 to 21.

Figure 10:
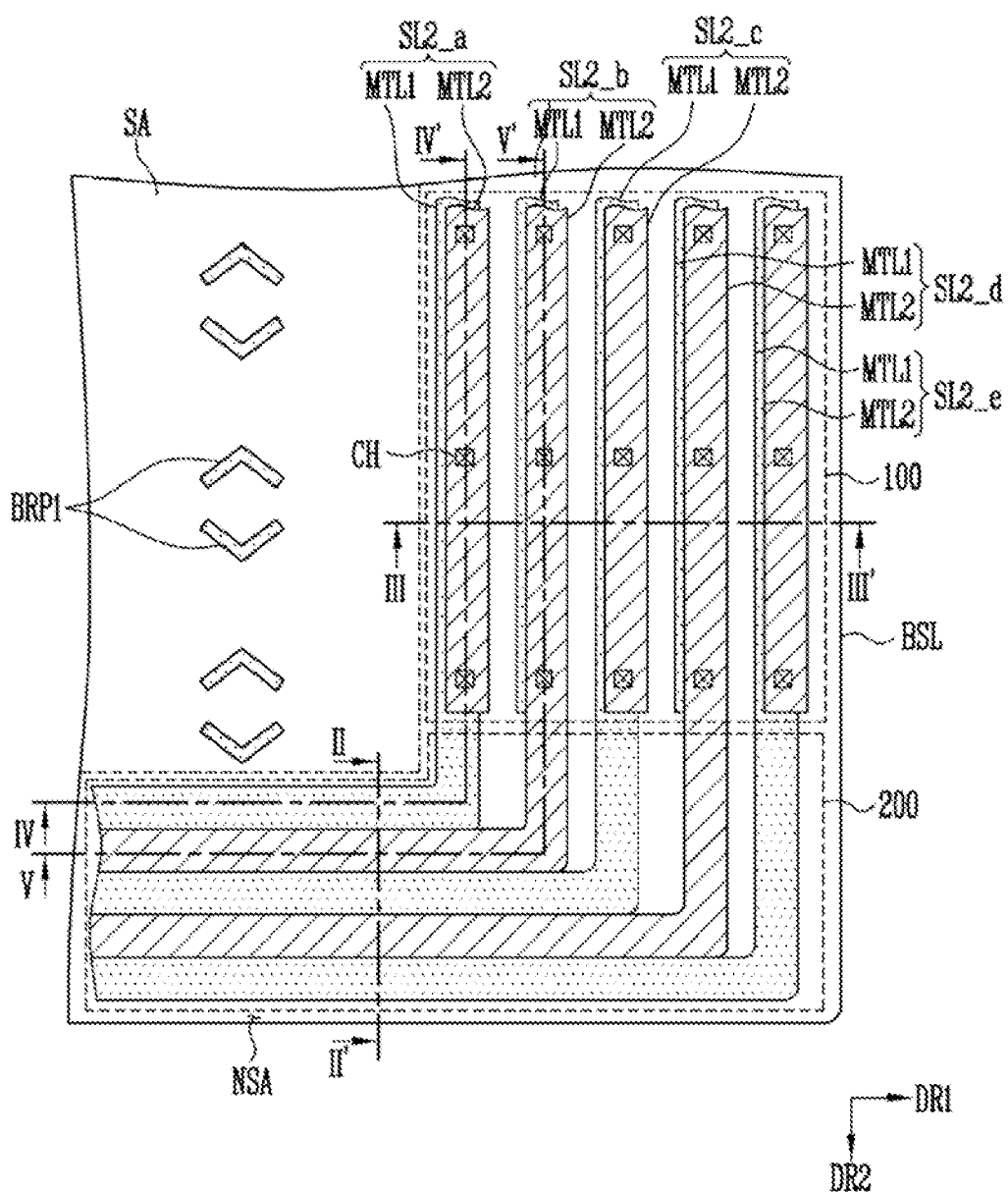
FIG. 10 schematically illustrates a sensing line of a touch sensor in accordance with an embodiment of the present disclosure.

FIG. 10 schematically illustrates a sensing line of a touch sensor in accordance with an embodiment of the present disclosure. To be more specific, FIG. 10 illustrates area EA2 of FIG. 7. In FIG. 10, the first sensor pattern SP1, the second sensor pattern SP2, and the second bridge pattern BRP2 disposed in the sensing area SA are omitted.

Hereinafter, for convenience, the "sensing line" of the touch sensor TS will be described with reference to the second sensing line SL2. However, embodiments of the present disclosure are not limited thereto, and the first sensing line SL1 or an electrical coupling configuration corresponding thereto should be interpreted in consideration of the following description.

In an embodiment, the second sensing line SL2 is located in the non-sensing area NSA. The second sensing line SL2 is disposed on the base layer BSL. The sensing electrode is not disposed in the non-sensing area NSA. A component in the non-sensing area NSA will not sense a touch input received from a user.

In an embodiment, the second sensing line SL2 include a 2a sensing line SL2_a, a 2b sensing line SL2_b, a 2c sensing line SL2_c, a 2d sensing line SL2_d, and a 2e sensing line SL2_e. As described above, the second sensing line SL2 is electrically coupled to the second sensor pattern SP2. Although the second sensing line SL2 is described as including five sensing lines, embodiments of the present disclosure are not limited thereto. In other words, the number of the second sensing line SL2 can vary in other embodiments.

In an embodiment, each of the 2a sensing line SL2_a, the 2b sensing line SL2_b, the 2c sensing line SL2_c, the 2d sensing line SL2_d, and the 2e sensing line SL2_e includes a first metal layer MTL1 and a second metal layer MTL2.

In an embodiment, at least a portion of the second sensing line SL2 is implemented with a double layer structure. The first metal layer MTL1 and the second metal layer MTL2 are disposed on different layers each other. The first metal layer MTL1 forms a first layer 320, shown in FIG. 11, of the second sensing line SL2, and the second metal layer MTL2 forms a second layer 340, shown in FIG. 11, of the second sensing line SL2. Here, an insulating layer is located between the first layer 320 and the second layer 340. The first layer 320 and the second layer 340 are divided by the insulating layer. For example, the first insulating layer INS1 may be located between the first layer 320 and the second layer 340 of the second sensing line SL2. The first layer 320 is the first metal layer MTL1 located under the first insulating layer INS1, and the second layer 340 is the second metal layer MTL2 located on the first insulating layer INS1.

Hereinafter, a layer that corresponds to the first metal layer MTL1 is referred to as the first layer 320, and a layer that corresponds to the second metal layer MTL2 is referred to as the second layer 340.

In an embodiment, the first metal layer MTL1 and the second metal layer MTL2 have different conductive patterns.

In an embodiment, the first metal layer MTL1 and the second metal layer MTL2 are electrically or physically coupled to each other through the contact hole CH.

In an embodiment, at least a portion of the second sensing line SL2 has one of the first metal layer MTL1 or the second metal layer MTL2. To be more specific, the second sensing line SL2 includes a first line area 100 and a second line area 200. The second sensing line SL2 includes the first metal layer MTL1 and the second metal layer MTL2 in the first line area 100. In contrast, the second sensing line SL2 includes one of the first metal layer MTL1 or the second metal layer MTL2 in the second line area 200.

In an embodiment, in the second line area 200, the 2a-th sensing line SL2_a has a single-layer structure that includes the first metal layer MTL1 without the second metal layer MTL2, the 2b-th sensing line SL2_b has a single-layer structure that includes the second metal layer MTL2 without the first metal layer MTL1, the 2c-th sensing line SL2_c has a single-layer structure that includes the first metal layer MTL1 without the second metal layer MTL2, the 2d-th sensing line SL2_d has a single-layer structure that includes the second metal layer MTL2 without the first metal layer MTL1, and the 2e-th sensing line SL2_e has a single-layer structure that includes the first metal layer MTL1 without the second metal layer MTL2.

In an embodiment, considering the the 2a-th sensing line SL2_a, the 2c-th sensing line SL2_c and the 2e-th sensing line SL2_e as first sensing lines, and the 2b-th sensing line SL2_b and the 2d-th sensing line SL2_d as second sensing lines, it can be seen from FIG. 10 that the first sensing lines and the second sensing lines are alternately disposed and adjacent to each other on the substrate.

Figure 11:
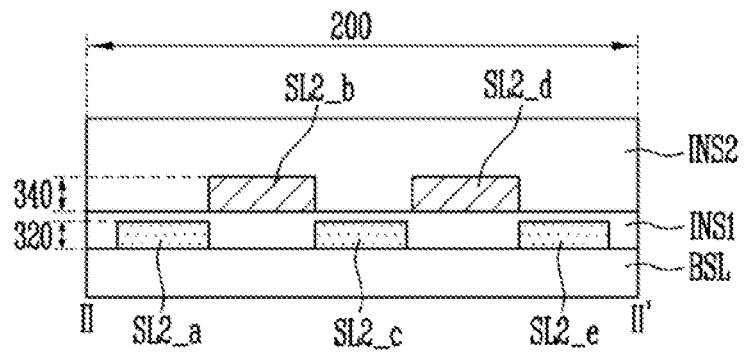
FIGS. 11 and 12 are sectional views taken along line II-II' of FIG. 10.
Figure 12:
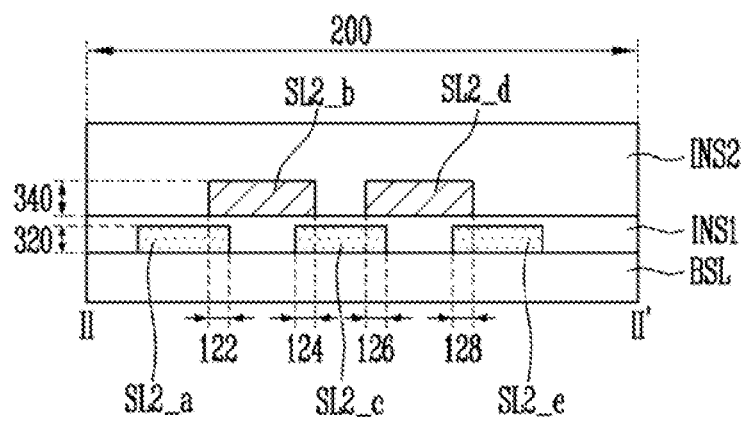

FIGS. 11 and 12 are sectional views taken along line II-II' of FIG. 10. In other words, FIGS. 11 and 12 illustrate the second line area 200 of the second sensing line SL2.

Referring to FIG. 11, in an embodiment, the first metal layer MTL1 of each of the 2a-th sensing line SL2_a, the 2c-th sensing line SL2_c, and the 2e-th sensing line SL2_e is disposed on the base layer BSL. The first insulating layer INS1 is disposed on the first metal layer MTL1 of each of the 2a-th sensing line SL2_a, the 2c-th sensing line SL2_c, and the 2e-th sensing line SL2_e.

In an embodiment, the sizes, such as surfaces or lengths, of the first layer 320 of the second sensing lines SL2 in the second line area 200 are equal to each other. To be more specific, the width of the first metal layer MTL1 of the 2a-th sensing line SL2_a in the second line area 200, the width of the first metal layer MTL1 of the 2c-th sensing line SL2_c in the second line area 200, and the width of the first metal layer MTL1 of the 2e-th sensing line SL2_e in the second line area 200 are equal to each other. That is, a resistance value per unit length for each of the 2a-th sensing line SL2_a, the 2c-th sensing line SL2_c, and the 2e-th sensing line SL2_e in the second line area 200 are substantially the same.

In an embodiment, the second metal layer MTL2 of the 2b-th sensing line SL2_b in the second line area 200 and the second metal layer MTL2 of the 2d-th sensing line SL2_d in the second line area 200 are disposed on the first insulating layer INS1. The second insulating layer INS2 is disposed on the second metal layer MTL2 of the 2b-th sensing line SL2_b and the second metal layer MTL2 of the 2d-th sensing line SL2_d.

In an embodiment, the sizes, such as surfaces or lengths, of the second layer 340 of the second sensing lines SL2 in the second line area 200 are equal to each other. In detail, the width of the second metal layer MTL2 of the 2b-th sensing line SL2_b in the second line area 200 and the width of the second metal layer MTL2 of the 2d-th sensing line SL2_d in the second line area 200 are equal to each other. That is, the resistance value per unit length for each of the 2b-th sensing line SL2_b and the 2d-th sensing line SL2_d of the second line area 200 are substantially the same.

In an embodiment, the thickness of the second layer 340 of the second sensing line SL2 is greater than the thickness of the first layer 320 of the second sensing line SL2. The thickness of the second metal layer MTL2 of the second sensing line SL2 is greater the thickness of the first metal layer MTL1 of the second sensing line SL2.

In an embodiment, the second layer 340 of the second sensing line SL2 does not overlap the first layer 320 of the second sensing line SL2, when viewed in a direction perpendicular to a surface of the base layer BSL. For example, the second metal layer MTL2 of the 2b-th sensing line SL2_b does not overlap the first layer 320 of the 2a-th sensing line SL2_a or the 2c-th sensing line SL2_c, when viewed from above. The second metal layer MTL2 of the 2d-th sensing line SL2_d does not overlap the first layer 320 of the 2c-th sensing line SL2_c or the 2e-th sensing line SL2_e, when viewed from above. The expression "when viewed from above" as used herein means when viewed in the direction perpendicular to the surface of the base layer BSL, namely, the third direction DR3 shown with reference to FIG. 1.

That is, in an embodiment, the second metal layer MTL2 of the second layer 340 and the first metal layer MTL1 of the first layer 320, when viewed from above, has a stratum structure where at least some areas are misaligned. In other words, when viewed from above, the metal layer of the stratum structure in the second line area 200 of each of the 2a-th to 2e-th sensing lines SL2_a to SL2_e does not overlap the metal layer of the stratum structure located in the second line area 200 of the adjacent second sensing line SL2.

The sectional view of FIG. 12 illustrates a modified structure of the second sensing line SL2 that has been described above with reference to FIG. 11.

Referring to FIG. 12, in an embodiment, at least a portion of the second layer 340 of the 2b-th sensing line SL2_b overlaps the first metal layer MTL1 of the 2a-th sensing line SL2_a or the first metal layer MTL1 of the 2c-th sensing line SL2_c. When viewed from above, the 2a-th sensing line SL2_a has a first overlap area 122 that overlaps the 2b-th sensing line SL2_b. When viewed from above, the 2c-th sensing line SL2_c has a second overlap area 124 that overlaps the 2b-th sensing line SL2_b. The width of the first overlap area 122 and the width of the second overlap area 124 are less than the width of the 2b-th sensing line SL2_b.

In an embodiment, at least a portion of the second layer 340 of the 2d-th sensing line SL2_d overlaps the first metal layer MTL1 of the 2c-th sensing line SL2_c or the first metal layer MTL1 of the 2e-th sensing line SL2_e. When viewed from above, the 2c-th sensing line SL2_c has a third overlap area 126 that overlaps the 2d-th sensing line SL2_d. When viewed from above, the 2e-th sensing line SL2_e has a fourth overlap area 128 that overlaps the 2d-th sensing line SL2_d. The width of the third overlap area 126 and the width of the fourth overlap area 128 are less than the width of the 2d-th sensing line SL2_d.

Figure 13:
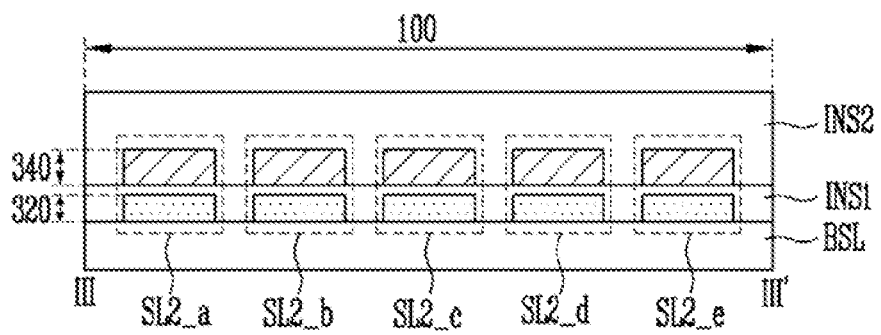
FIG. 13 is a sectional view taken along line III-III' of FIG. 10.

FIG. 13 is a sectional view taken along line III-III' of FIG. 10. In other words, FIG. 13 illustrates the first line area 100 of the second sensing lines SL2.

In an embodiment, the first metal layer MTL1 and the second metal layer MTL2 of each of the second sensing lines SL2 are located in the first line area 100. In other words, each of the second sensing lines SL2 in implemented in a double layer in the first line area 100. The first metal layer MTL1 of each of the 2a-th sensing line SL2_a, the 2b-th sensing line SL2_b, the 2c-th sensing line SL2_c, the 2d-th sensing line SL2_d, and the 2e-th sensing line SL2_e is located in the first layer 320 in the first line area 100. The second metal layer MTL2 of each of the 2a-th sensing line SL2_a, the 2b-th sensing line SL2_b, the 2c-th sensing line SL2_c, the 2d-th sensing line SL2_d, and the 2e-th sensing line SL2_e is located in the second layer 340 of the first line area 100.

In an embodiment, in the first line area 100, the width of the first metal layer MTL1 of the 2a-th sensing line SL2_a is equal to the width of the second metal layer MTL2 of the 2a-th sensing line SL2_a, the width of the first metal layer MTL1 of the 2b-th sensing line SL2_b is equal to the width of the second metal layer MTL2 of the 2b-th sensing line SL2_b, the width of the first metal layer MTL1 of the 2c-th sensing line SL2_c is equal to the width of the second metal layer MTL2 of the 2c-th sensing line SL2_c, the width of the first metal layer MTL1 of the 2d-th sensing line SL2_d is equal to the width of the second metal layer MTL2 of the 2d-th sensing line SL2_d, and the width of the first metal layer MTL1 of the 2e-th sensing line SL2_e is equal to the width of the second metal layer MTL2 of the 2e-th sensing line SL2_e.

Figure 14:
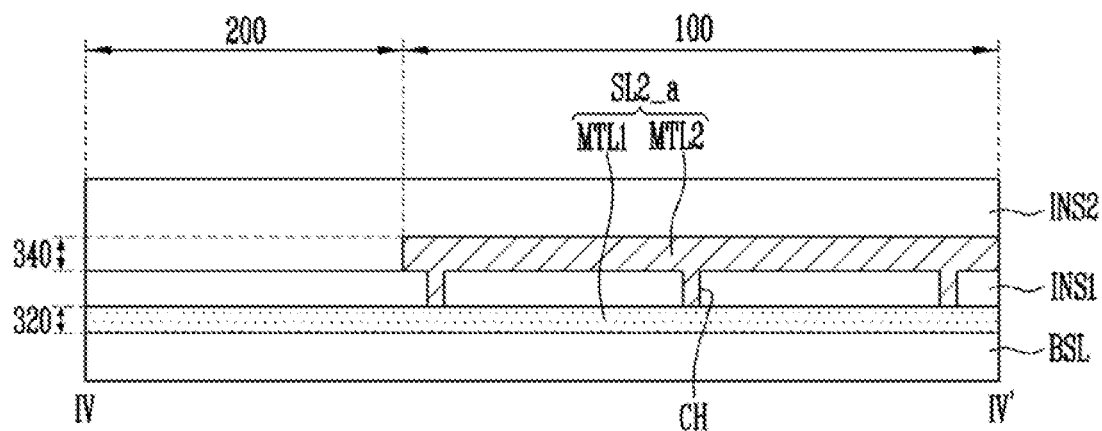
FIG. 14 is a sectional view taken along line IV-IV' of FIG. 10.

FIG. 14 is a sectional view taken along line IV-IV' of FIG. 10. FIG. 14 illustrates an embodiment where in the second line area 200, the second sensing line SL2 includes the first metal layer MTL1 but not the second metal layer MTL2.

Although FIG. 14 illustrates the 2a-th sensing line SL2_a, the 2c-th sensing line SL2_c and the 2e-th sensing line SL2_e have a substantially similar structure and should be interpreted in consideration of the structure of the 2a-th sensing line SL2_a in FIG. 14.

Referring to FIG. 14, in an embodiment, the first metal layer MTL1 is disposed on the base layer BSL. The first insulating layer INS1 is disposed on the base layer BSL.

In an embodiment, the second metal layer MTL2 is disposed on the first insulating layer INS1 in the first line area 100. In the first line area 100, the first metal layer MTL1 is electrically coupled to the second metal layer MTL2 through the contact hole CH. In the first line area 100, the second insulating layer INS2 is disposed on the second metal layer MTL2.

In an embodiment, the second metal layer MTL2 is not disposed on the first insulating layer INS1 in the second line area 200. In the second line area 200, the second insulating layer INS2 is disposed on the first insulating layer INS1.

In an embodiment, in the first line area 100, the 2a-th sensing line SL2_a includes the first metal layer MTL1 on the base layer BSL and the second metal layer MTL2. The second metal layer MTL2 is electrically coupled to the first metal layer MTL1 through the contact holes CH and is disposed on the first metal layer MTL1 with the first insulating layer INS1 being interposed between the first and second metal layers. In the second line area 200, the 2a-th sensing line SL2_a has a single-layer structure that includes the first metal layer MTL1 on the base layer BSL, but not the second metal layer MTL2. The first metal layer MTL1 in the first line area 100 and the first metal layer MTL1 in the second line area 200 are integrally formed and coupled to each other.

Figure 15:
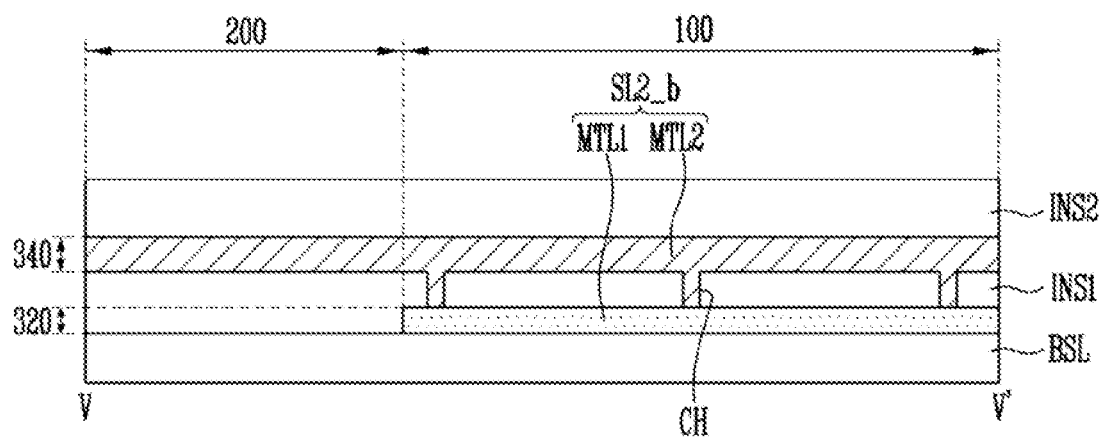
FIG. 15 is a sectional view taken along line V-V' of FIG. 10.

FIG. 15 is a sectional view taken along line V-V' of FIG. 10. FIG. 15 illustrates an embodiment where in the second line area 200, the second sensing line SL2 includes the second metal layer MTL2 without the first metal layer MTL1.

Although FIG. 15 illustrates the 2b-th sensing line SL2_b, the 2d-th sensing line SL2_d has a substantially similar structure and should be interpreted in consideration of the structure of the 2b-th sensing line SL2_b in FIG. 15.

Referring to FIG. 15, in an embodiment, in the first line area 100, the first metal layer MTL1 is disposed on the base layer BSL, and the first insulating layer INS1 is disposed on the first metal layer MTL1. In addition, in the first line area 100, the second metal layer MTL2 is disposed on the first insulating layer INS1. In the first line area 100, the first metal layer MTL1 may be electrically coupled to the second metal layer MTL2 through the contact hole CH. In the first line area 100, the second insulating layer INS2 is disposed on the second metal layer MTL2.

In an embodiment, in the second line area 200, the first insulating layer INS1 is disposed on the base layer BSL, and the first metal layer MTL1 is not disposed on the first insulating layer INS1. In the second line area 200, the second metal layer MTL2 is disposed on the first insulating layer INS1. In the second line area 200, the second insulating layer INS2 is disposed on the second metal layer MTL2.

In an embodiment, in the first line area 100, the 2b-th sensing line SL2_b includes the first metal layer MTL1 on the base layer BSL and the second metal layer MTL2. The second metal layer MTL2 is electrically coupled to the first metal layer MTL1 through the contact holes CH and is disposed on the first metal layer MTL1 with the first insulating layer INS1 being interposed between the first and second metal layers. In the second line area 200, the 2b-th sensing line SL2_b has a single-layer structure that includes the second metal layer MTL2 on the first insulating layer INS1, but not the first metal layer MTL1. The second metal layer MTL2 in the first line area 100 and the second metal layer MTL2 in the second line area 200 are integrally formed and coupled to each other.

In an embodiment as described above with reference to FIGS. 14 and 15, each of the second sensing lines SL2 is formed with a double metal layer in the first line area 100, and with a single metal layer in the second line area 200.

According to an embodiment of the disclosure, a touch sensor includes a plurality of sensing lines SL disposed on a substrate SUB. Each of the plurality of sensing lines SL includes a first area 100 and a second area 200, and each of the plurality of sensing lines includes a first metal layer MTL1 and a second metal layer MTL2 electrically coupled to a sensing electrode SP. The second metal layer MTL2 is disposed on the first metal layer MTL1. The plurality of sensing lines SL includes a first sensing line SL1 and a second sensing line SL2. The first sensing line SL1 and the second sensing line SL2 each include the first metal layer MTL1 and the second metal layer MTL2 in the first area 100, the first sensing line SL1 includes the first metal layer MTL1 without the second metal layer MTL2 in the second area 200, and the second sensing line SL2 includes the second metal layer MTL2 without the first metal layer MTL1 in the second area 200. The first sensing line SL1 and the second sensing line SL2 are alternately disposed and adjacent to each other on the substrate SUB.

Figure 16:
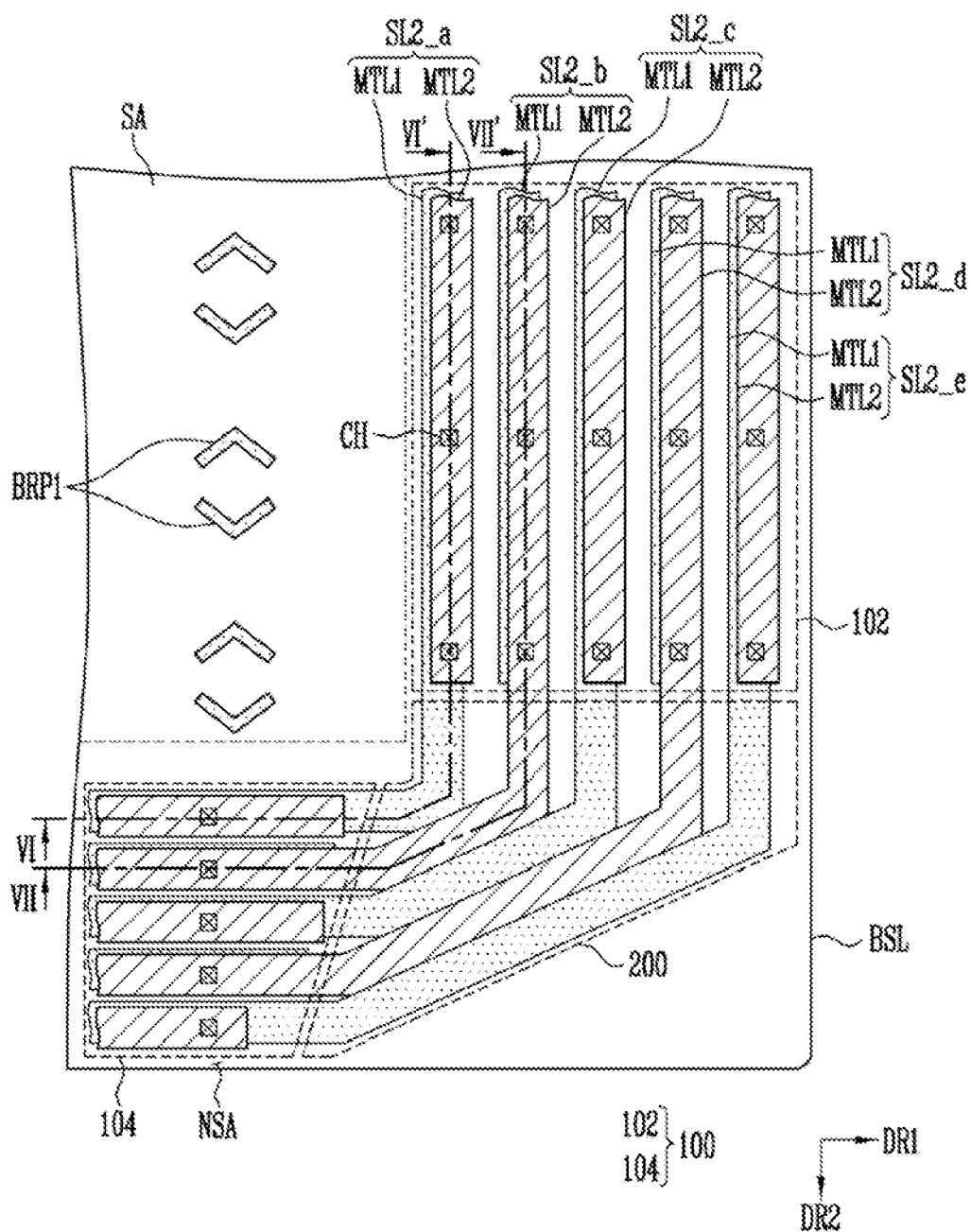
FIG. 16 schematically illustrates a touch sensor in accordance with a modification of an embodiment of the present disclosure.

FIG. 16 schematically illustrates a touch sensor in accordance with a modified embodiment of the present disclosure.

Referring to FIG. 16, the second line area 200 may be located between the plurality of first line areas 102 and 104.

In an embodiment, the metal layer in the second line area 200 has a stratum structure that allows more lines to be disposed in the second sensing line SL2, as compared with a structure in which multiple layers are implemented by one metal line is located on a single layer. That is, in an embodiment, the second line area 200 is selectively located where an area in which lines are arranged is relatively small. According to an embodiment, and referring to a stratum structure described with reference to FIGS. 11 and 12, the second line area 200 is located on a lower end of the display device DD. Alternatively, the second line area 200 may be located in an edge area or a corner area of the display device DD.

FIG. 17 is a sectional view taken along line VI-VI' of FIG. 16. Although FIG. 17 illustrates the 2a-th sensing line SL2_a, the 2c-th sensing line SL2_c and the 2e-th sensing line SL2_e have substantially similar structures and should be interpreted in consideration of the structure of the 2a-th sensing line SL2_a of FIG. 17.

Referring to FIG. 17, in an embodiment, the first line area 100 includes a 1-1-th line area 102 and a 1-2-th line area 104. The second line area 200 is positioned between the 1-1-th line area 102 and the 1-2-th line area 104.

In an embodiment, the first metal layer MTL1 is disposed on the base layer BSL. The first insulating layer INS1 is disposed on the first metal layer MTL1.

In an embodiment, in the 1-1-th line area 102 and the 1-2-th line area 104, the second metal layer MTL2 is disposed on the first insulating layer INS1. The second metal layer MTL2 and the first metal layer MTL1 in each of the 1-1-th line area 102 and the 1-2-th line area 104 are electrically coupled to each other through the contact holes CH. The second insulating layer INS2 is disposed on the second metal layer MTL2 in the 1-1-th line area 102 and the 1-2-th line area 104.

In an embodiment, in the second line area 200, the second metal layer MTL2 is not disposed on the first insulating layer INS1. The second insulating layer INS2 is disposed on the first insulating layer INS1 in the second line area 200.

FIG. 18 is a sectional view taken along line VII-VII' of FIG. 16. Although FIG. 18 illustrates the 2b-th sensing line SL2_b, the 2d-th sensing line SL2_d is substantially similar in structure and should be interpreted in consideration of the structure of the 2b-th sensing line SL2_b in FIG. 18.

Referring to FIG. 18, in an embodiment, the first line area 100 includes the 1-1-th line area 102 and the 1-2-th line area 104, similar to FIG. 17.

In an embodiment, in the 1-1-th line area 102 and the 1-2-th line area 104, the first metal layer MTL1 is disposed on the base layer BSL, and the first insulating layer INS1 is disposed on the first metal layer MTL1. The second metal layer MTL2 is disposed on the first insulating layer INS1 in the 1-1-th line area 102 and the 1-2-th line area 104.

In an embodiment, in the second line area 200, the first metal layer MTL1 is not disposed on the first insulating layer INS1. The second metal layer MTL2 is disposed on the first insulating layer INS1 in the second line area 200. The second insulating layer INS2 is disposed on the second metal layer MTL2.

Hereinafter, a resistance compensation structure of a touch sensor in accordance with an embodiment of the present disclosure will be described with reference to FIGS. 19 to 21.

FIG. 19 schematically illustrates a touch sensor in accordance with an embodiment of the present disclosure, in which at least a portion of a sensing line has a resistance compensation structure.

Referring to FIG. 19, in an embodiment, each of the second sensing lines SL2 further includes a third line area 300.

In an embodiment, the first line area 100 of each of the second sensing lines SL2 is an area where the width of the first metal layer MTL1 is equal to the width of the second metal layer MTL2. The second line area 200 of each of the second sensing lines SL2 is an area where second sensing lines SL2 have a single layer structure that includes the first metal layer MTL1 or a single layer structure that includes the second metal layer MTL2. Compared with the first line area 100, the third line area 300 of each of the second sensing lines SL2 is an area of the second sensing lines SL2 where the width of the first metal layer MTL1 differs from the width of the second metal layer MTL2.

In an embodiment, in the third line area 300, the width of the first metal layer MTL1 differs from the width of the second metal layer MTL2. For example, the width of the first metal layer MTL1 of the 2a-th sensing line SL2_a differs from the width of the second metal layer MTL2 of the 2a-th sensing line SL2_a. The width of the first metal layer MTL1 of the 2b-th sensing line SL2_b differs from the width of the second metal layer MTL2 of the 2b-th sensing line SL2_b. The width of the first metal layer MTL1 of the 2c-th sensing line SL2_c differs from the width of the second metal layer MTL2 of the 2c-th sensing line SL2_c. The width of the first metal layer MTL1 of the 2d-th sensing line SL2_d differs from the width of the second metal layer MTL2 of the 2d-th sensing line SL2_d. The width of the first metal layer MTL1 of the 2e-th sensing line SL2_e differs from the width of the second metal layer MTL2 of the 2e-th sensing line SL2_e.

In an embodiment, as described above, at least a portion of the second sensing line SL2 are located in the second line area 200, and the size of the third line area 300 can be determined from the size of the second line area 200.

Figure 20:
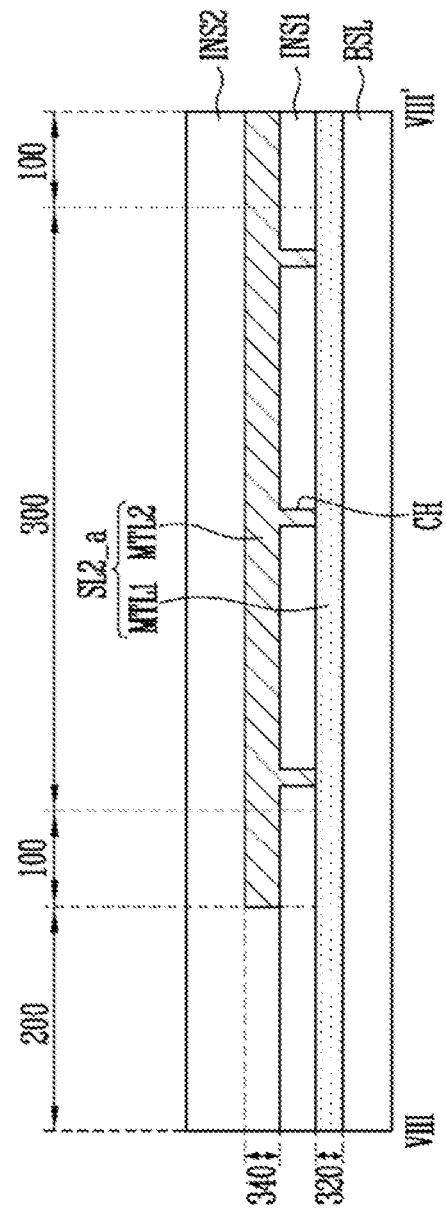
FIG. 20 is a sectional view taken along line VIII-VIII' of FIG. 19.

FIG. 20 is a sectional view taken along line VIII-VIII' of FIG. 19. Referring to FIG. 20, the third line area 300 is located between a pair of first line areas 100. At least some of the first line areas 100 are positioned between the second line area 200 and the third line area 300.

In the third line area 300, in an embodiment, the first metal layer MTL1 is disposed on the base layer BSL, and the first insulating layer INS1 is disposed on the first metal layer MTL1. In the third line area 300, the second metal layer MTL2 is disposed on the first insulating layer INS1 and the second insulating layer INS2 is disposed on the second metal layer MTL2.

Figure 21:
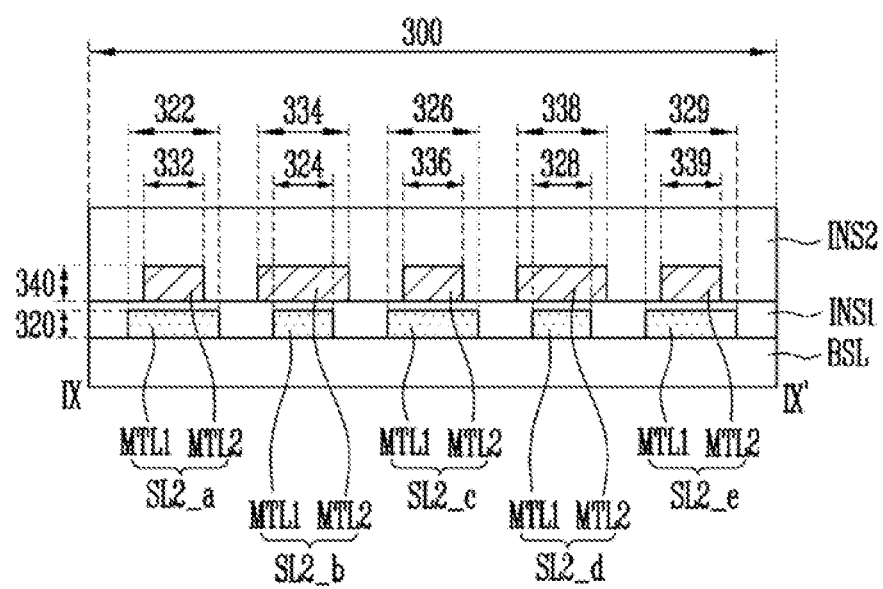
FIG. 21 is a sectional view taken along line IX-IX' of FIG. 19.

FIG. 21 is a sectional view taken along line IX-IX' of FIG. 19.

Referring to FIG. 21, in an embodiment, in the third line area 300 of the sensing lines SL2, the first metal layer MTL1 of the 2a-th to 2e-th sensing lines SL2_a to SL2_e is disposed on the base layer BSL, and the first insulating layer INS1 is disposed on the first metal layer MTL1 of the 2a-th to 2e-th sensing lines SL2_a to SL2_e. The second metal layer MTL2 of the 2a-th to 2e-th sensing lines SL2_a to SL2_e is disposed on the first insulating layer INS1. The second insulating layer INS2 is disposed on the second metal layer MTL2 of the 2a-th to 2e-th sensing lines SL2_a to SL2_e.

In an embodiment, a width of the first metal layer MTL1 of the 2a-th sensing line SL2_a has a 1-1-th width 322. A width of the second metal layer MTL2 of the 2a-th sensing line SL2_a has a 1-2-th width 332. The 1-1-th width 322 and the 1-2-th width 332 differ from each other. The 1-1-th width 322 is at least greater than the 1-2-th width 332. Here, the 1-1-th width 322 is equal to the width of the first metal layer MTL1 of the 2a-th sensing line SL2_a in the second line area 200.

In an embodiment, a width of the first metal layer MTL1 of the 2b-th sensing line SL2_b has a 2-1-th width 324. A width of the second metal layer MTL2 of the 2b-th sensing line SL2_b has a 2-2-th width 334. The 2-1-th width 324 and the 2-2-th width 334 differ from each other. The 2-2-th width 334 is at least greater than the 2-1-th width 324. Here, the 2-1-th width 324 is equal to the width of the second metal layer MTL2 of the 2b-th sensing line SL2_b in the second line area 200.

In an embodiment, a width of the first metal layer MTL1 of the 2c-th sensing line SL2_c has a 3-1-th width 326. A width of the second metal layer MTL2 of the 2c-th sensing line SL2_c has a 3-2-th width 336. The 3-1-th width 326 and the 3-2-th width 336 differ from each other. The 3-1-th width 326 is at least greater than the 3-2-th width 336. Here, the 3-1-th width 326 is equal to the width of the first metal layer MTL1 of the 2c-th sensing line SL2_c in the second line area 200.

In an embodiment, a width of the first metal layer MTL1 of the 2d-th sensing line SL2_d has a 4-1-th width 328. A width of the second metal layer MTL2 of the 2d-th sensing line SL2_d has a 4-2-th width 338. The 4-1-th width 328 and the 4-2-th width 338 differ from each other. The 4-2-th width 338 is at least greater than the 4-1-th width 328. Here, the 4-1-th width 328 is equal to the width of the second metal layer MTL2 of the 2b-th sensing line SL2_b in the second line area 200.

In an embodiment, a width of the first metal layer MTL1 of the 2e-th sensing line SL2_e has a 5-1-th width 329. A width of the second metal layer MTL2 of the 2e-th sensing line SL2_e has a 5-2-th width 339. The 5-1-th width 329 and the 5-2-th width 339 differ from each other. The 5-1-th width 329 is at least greater than the 5-2-th width 339. Here, the 5-1-th width 329 is equal to the width of the first metal layer MTL1 of the 2*e-th* sensing line SL2_*e* in the second line area 200.

In other words, according to an embodiment, some areas of the second sensing lines SL2 are located in the third line area 300. The second sensing lines SL2 in the third line area 300 have changed resistance values because at least one of the first metal layer MTL1 and the second metal layer MTL2 has a reduced width, and a change in resistance value caused by forming a single-layer structure, i.e. the second line area 200, can be applied to a double-layer structure, i.e. the first line area 100.

The above description is merely illustrative of the technical idea of embodiments of the present disclosure, and it is apparent to those of ordinary skill in the art that embodiments of the present disclosure can be changed and modified in various ways without departing from the scope of embodiments of the present disclosure. Therefore, exemplary embodiments may be implemented separately or in combination.

Therefore, as exemplary embodiments of the present embodiments are illustrative and not restrictive, it should be understood that the technical spirit of embodiments of the present disclosure is not limited to exemplary embodiments. The scope of embodiments of the present disclosure is therefore to be determined solely by the appended claims. All technical ideas with an equivalent scope should be interpreted as being included in the scope of embodiments of the present disclosure.

An embodiment of the present disclosure provides a touch sensor in which a plurality of signal lines is provided on a single layer in at least some areas, thus securing a space sufficient to accommodate the signal lines, and a display device including the touch sensor.

Another embodiment of the present disclosure provides a touch sensor in which a width of a signal line in some areas is changed so that resistance data changes linearly according to a position, and a display device including the touch sensor.

Embodiments of the present disclosure are not limited to the above-described effects, and other effects that are not mentioned will be clearly understood by those skilled in the art from the present specification and the accompanying drawings.

What is claimed is:

1. A touch sensor, comprising:
   a base layer that includes a sensing area and a non-sensing area, wherein the non-sensing area includes a first area and a second area, and
   sensing lines on the non-sensing area and that include a first metal layer and a second metal layer,
   wherein the second metal layer is on the first metal layer, and an insulating layer is between the first metal layer and the second metal layer,
   wherein the sensing lines includes a first sensing line and a second sensing line adjacent to the first sensing line, and
   wherein the first sensing line and the second sensing line do not overlap each other in the first area and overlap each other in the second area, when viewed from above.

2. The touch sensor according to claim 1, wherein
   the first sensing line includes the first metal layer without the second metal layer in the second area, and
   the second sensing line includes the second metal layer without the first metal layer in the second area.

3. The touch sensor according to claim 2,
   wherein the first sensing line and the second sensing line each include the first metal layer and the second metal layer in the first area, and
   wherein the first metal layer of the first sensing line overlap the second metal layer of the second sensing line, in the second area, when viewed from above.

4. The touch sensor according to claim 1, wherein the first metal layer and the second metal layer are on different layers each other.

5. The touch sensor according to claim 1, further comprising
   a sensing electrode that receives a touch input and is disposed on the sensing area,
   wherein the first metal and the second metal are electrically coupled to the sensing electrode.

6. The touch sensor according to claim 2,
   wherein the first metal layer of the first sensing line and the second metal layer of the first sensing line overlap each other by a first overlapped width in the first area,
   wherein the first metal layer of the first sensing line and the second metal layer of the second sensing line overlap each other by a second overlapped width in the second area, and
   wherein the first overlapped width is larger than the second overlapped width.

7. The touch sensor according to claim 1, wherein the first sensing line and the second sensing line are alternately disposed and adjacent to each other.

8. The touch sensor according to claim 1, wherein a width of the first metal layer of the first sensing line is equal to a width of the second metal layer of the second sensing line.

9. The touch sensor according to claim 1, wherein a thickness of the second metal layer is greater than a thickness of the first metal layer.

10. The touch sensor according to claim 1, wherein the first metal layer and the second metal layer are electrically coupled to each other via a contact hole formed in the insulating layer.

11. The touch sensor according to claim 2,
    wherein the non-sensing area further includes an additional area adjacent to the second area,
    wherein the second area is disposed between the first area and the additional area, and
    wherein the second metal layer of the first sensing line in the additional area is electrically connected to the first metal layer of the first sensing line in the second area through a contact hole formed in the insulating layer.

12. A touch sensor, comprising:
    a base layer that includes a sensing area and a non-sensing area that includes a first area and a second area, and
    sensing lines on the non-sensing area and that include a first metal layer and a second metal layer,
    wherein the second metal layer is on the first metal layer, and an insulating layer is between the first metal layer and the second metal layer,
    wherein the first metal layer and the second metal layer continuously extend from the first area to the second area,
    wherein the first metal layer and the second metal layer overlap each other by a first overlapped width in the first area,
    wherein the first metal layer and the second metal layer overlap each other by a second overlapped width in the second area, and
    wherein the first overlapped width is larger than the second overlapped width.

13. The touch sensor according to claim 12,
wherein the sensing lines includes a first sensing line and a second sensing line adjacent to the first sensing line,
wherein the first sensing line includes the first metal layer without the second metal layer in the second area, and the second sensing line includes the second metal layer without the first metal layer in the second area.

14. The touch sensor according to claim 13,
wherein the first metal layer of the first sensing line and the second metal layer of the first sensing line overlap each other in the first area by the first overlapped width when viewed from above, and
wherein the first metal layer of the second sensing line and the second metal layer of the second sensing line overlap each other in the first area by the first overlapped width when viewed from above.

15. The touch sensor according to claim 13, wherein the first metal layer of the first sensing line and the second metal layer of the second sensing line overlap each other in the second area by the second overlapped width when viewed from above.

16. The touch sensor according to claim 13, further comprising a sensing electrode that receives a touch input and is disposed on the sensing area,
wherein the first metal and the second metal are electrically coupled to the sensing electrode.

17. The touch sensor according to claim 13, wherein the first sensing line and the second sensing line are alternately disposed and adjacent to each other.

18. The touch sensor according to claim 13,
wherein the non-sensing area further includes an additional area adjacent to the second area,
wherein the second area is disposed between the first area and the additional area, and
wherein the second metal layer of the first sensing line in the additional area is electrically connected to the first metal layer of the first sensing line in the second area through a contact hole formed in the insulating layer.

19. A display device comprising the touch sensor according to claim 1.

20. A display device comprising the touch sensor according to claim 12.

* * * * *